United States Patent
Yamauchi et al.

(10) Patent No.: US 10,971,431 B2
(45) Date of Patent: Apr. 6, 2021

(54) SEMICONDUCTOR DEVICE, COOLING MODULE, POWER CONVERTING DEVICE, AND ELECTRIC VEHICLE

(71) Applicant: FUJI ELECTRIC CO., LTD., Kawasaki (JP)

(72) Inventors: Kohei Yamauchi, Matsumoto (JP); Hiromichi Gohara, Matsumoto (JP); Katsumi Taniguchi, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 27 days.

(21) Appl. No.: 16/361,979

(22) Filed: Mar. 22, 2019

(65) Prior Publication Data

US 2019/0371705 A1 Dec. 5, 2019

(30) Foreign Application Priority Data

May 30, 2018 (JP) .............................. JP2018-103969

(51) Int. Cl.
| | |
|---|---|
| *H01L 23/473* | (2006.01) |
| *H01L 23/467* | (2006.01) |
| *H01L 23/367* | (2006.01) |
| *H01L 23/50* | (2006.01) |
| *H02M 7/00* | (2006.01) |
| *H02P 27/06* | (2006.01) |
| *H02M 7/537* | (2006.01) |

(52) U.S. Cl.
CPC ........ *H01L 23/473* (2013.01); *H01L 23/3675* (2013.01); *H01L 23/467* (2013.01); *H01L 23/50* (2013.01); *H02M 7/003* (2013.01); *H02M 7/537* (2013.01); *H02P 27/06* (2013.01)

(58) Field of Classification Search
CPC ...... H01L 23/46; H01L 23/467; H01L 23/473
USPC ........... 257/714, E23.097, E23.098, E23.099
See application file for complete search history.

(56) References Cited

U.S. PATENT DOCUMENTS

| | | | | |
|---|---|---|---|---|
| 4,268,850 A | * | 5/1981 | Lazarek | F28F 3/12 165/80.4 |
| 4,825,284 A | * | 4/1989 | Soga | H01L 21/563 257/714 |
| 6,367,543 B1 | * | 4/2002 | Calaman | F28F 3/022 165/134.1 |

(Continued)

FOREIGN PATENT DOCUMENTS

| | | | | |
|---|---|---|---|---|
| EP | 1936685 A2 | * | 6/2008 | ........... H01L 21/563 |
| FR | 2993398 A1 | * | 1/2014 | ......... H01L 25/0657 |

(Continued)

*Primary Examiner* — Victoria K. Hall

(57) ABSTRACT

A semiconductor device includes: a first cooling device including a plurality of first flow channels through which a fluid flows, between a first main surface and a second main surface opposed to each other; a second cooling device including a plurality of second flow channels through which a fluid flows, between a third main surface and a fourth main surface parallel to the first main surface; a semiconductor element interposed between the first main surface and the third main surface facing each other; and a control terminal penetrating from the third main surface to the fourth main surface in a terminal-penetrating region defined at a predetermined position between the plurality of second flow channels, and electrically connected to a control electrode of the semiconductor element.

12 Claims, 25 Drawing Sheets

(56) References Cited

U.S. PATENT DOCUMENTS

| | | | |
|---|---|---|---|
| 7,990,711 B1* | 8/2011 | Andry | H01L 23/147 165/80.4 |
| 8,742,556 B2 | 6/2014 | Kadoguchi et al. | |
| 9,305,910 B2 | 4/2016 | Horio et al. | |
| 10,361,174 B2* | 7/2019 | Bando | H01L 23/051 |
| 10,685,900 B2* | 6/2020 | Singh | H01L 23/4922 |
| 2001/0033477 A1* | 10/2001 | Inoue | H01L 23/49833 361/718 |
| 2002/0101718 A1* | 8/2002 | Negishi | F28F 3/025 361/699 |
| 2002/0185260 A1* | 12/2002 | Calaman | H01L 23/473 165/80.4 |
| 2002/0185718 A1* | 12/2002 | Mikubo | H01L 23/433 257/678 |
| 2004/0190251 A1* | 9/2004 | Prasher | H01L 23/473 361/699 |
| 2004/0196634 A1* | 10/2004 | Mallik | H01L 23/36 361/704 |
| 2005/0030717 A1* | 2/2005 | Inagaki | H01L 23/4334 361/699 |
| 2005/0073042 A1* | 4/2005 | Hirano | H01L 23/4338 257/717 |
| 2007/0085197 A1* | 4/2007 | Arai | H01L 23/473 257/712 |
| 2007/0096278 A1* | 5/2007 | Nakatsu | H01L 25/071 257/678 |
| 2007/0216013 A1* | 9/2007 | Funakoshi | H01L 24/33 257/691 |
| 2007/0227697 A1* | 10/2007 | Takahashi | H01L 23/473 165/80.4 |
| 2008/0073061 A1* | 3/2008 | Dias | H01L 23/427 165/80.4 |
| 2008/0150162 A1* | 6/2008 | Koizumi | H01L 23/473 257/778 |
| 2008/0160246 A1* | 7/2008 | Buhler | H01L 23/467 428/99 |
| 2008/0224303 A1* | 9/2008 | Funakoshi | H01L 23/473 257/701 |
| 2009/0141451 A1* | 6/2009 | Mori | H01L 23/3735 361/699 |
| 2009/0145642 A1* | 6/2009 | Kuromitsu | H05K 3/38 174/258 |
| 2009/0147479 A1* | 6/2009 | Mori | H01L 23/473 361/699 |
| 2009/0283902 A1* | 11/2009 | Bezama | H01L 23/3675 257/713 |
| 2010/0238627 A1* | 9/2010 | Shinohara | H01L 23/3107 361/695 |
| 2010/0264520 A1* | 10/2010 | Ogawa | H01L 23/3735 257/618 |
| 2010/0327455 A1* | 12/2010 | Nishihata | H01L 23/4334 257/773 |
| 2011/0037166 A1* | 2/2011 | Ikeda | H01L 24/32 257/712 |
| 2011/0134608 A1* | 6/2011 | Nakajima | H01L 23/3735 361/709 |
| 2011/0241198 A1* | 10/2011 | Azuma | H01L 23/3121 257/696 |
| 2012/0001341 A1* | 1/2012 | Ide | H01L 25/117 257/773 |
| 2012/0087095 A1* | 4/2012 | Tokuyama | H01L 23/467 361/721 |
| 2012/0181679 A1 | 7/2012 | Kadoguchi et al. | |
| 2012/0250253 A1* | 10/2012 | Chou | H02M 7/003 361/689 |
| 2012/0300402 A1* | 11/2012 | Vos | H01L 23/427 361/701 |
| 2013/0062743 A1* | 3/2013 | Kim | H01L 24/41 257/675 |
| 2013/0128646 A1* | 5/2013 | Nishihara | H01L 23/367 363/141 |
| 2014/0001604 A1* | 1/2014 | Sadaka | H01L 23/49822 257/621 |
| 2014/0117508 A1* | 5/2014 | Nishi | C04B 37/021 257/622 |
| 2014/0138075 A1* | 5/2014 | Yang | H01L 23/473 165/185 |
| 2014/0185243 A1* | 7/2014 | Joo | H01L 23/4334 361/709 |
| 2014/0376189 A1* | 12/2014 | Sakaguchi | H01L 23/473 361/719 |
| 2015/0091156 A1* | 4/2015 | Kim | H01L 23/427 257/713 |
| 2015/0243640 A1 | 8/2015 | Horio et al. | |
| 2016/0307821 A1* | 10/2016 | Maruyama | H01L 23/4006 |
| 2017/0314515 A1* | 11/2017 | Oono | H01L 23/473 |
| 2018/0098457 A1* | 4/2018 | Takeuchi | H02M 7/003 |
| 2018/0108593 A1* | 4/2018 | Terasaki | B23K 20/023 |
| 2018/0138152 A1* | 5/2018 | Jong | H01L 23/49894 |
| 2018/0261527 A1* | 9/2018 | Takeuchi | H02M 7/003 |
| 2018/0286774 A1* | 10/2018 | Nishibe | H01L 23/3107 |
| 2018/0332739 A1* | 11/2018 | Takeuchi | H05K 7/20927 |
| 2020/0152548 A1* | 5/2020 | Joshi | H01L 23/473 |
| 2020/0294968 A1* | 9/2020 | Sikka | H01L 25/0657 |

FOREIGN PATENT DOCUMENTS

| | | | | |
|---|---|---|---|---|
| FR | 2993399 A1 | * | 1/2014 | ........... H01L 23/473 |
| JP | 2002-26469 A | | 1/2002 | |
| JP | 2008-103623 A | | 5/2008 | |
| JP | 2011-115020 A | | 6/2011 | |
| JP | 2012-146919 A | | 8/2012 | |
| JP | 2014-53440 A | | 3/2014 | |
| JP | 2014216589 A | * | 11/2014 | |
| JP | 2015008169 A | * | 1/2015 | ........... H01L 23/473 |
| JP | 6196815 B2 | * | 9/2017 | ........... H05K 1/0203 |
| WO | WO-2012165598 A1 | * | 12/2012 | ......... H01L 25/0657 |
| WO | 2013/118415 A1 | | 8/2013 | |
| WO | 2014/132483 A1 | | 9/2014 | |
| WO | 2015/194259 A1 | | 12/2015 | |
| WO | 2016/009727 A1 | | 1/2016 | |
| WO | WO-2017179736 A1 | * | 10/2017 | ........... H01L 23/473 |

\* cited by examiner

FIG. 12
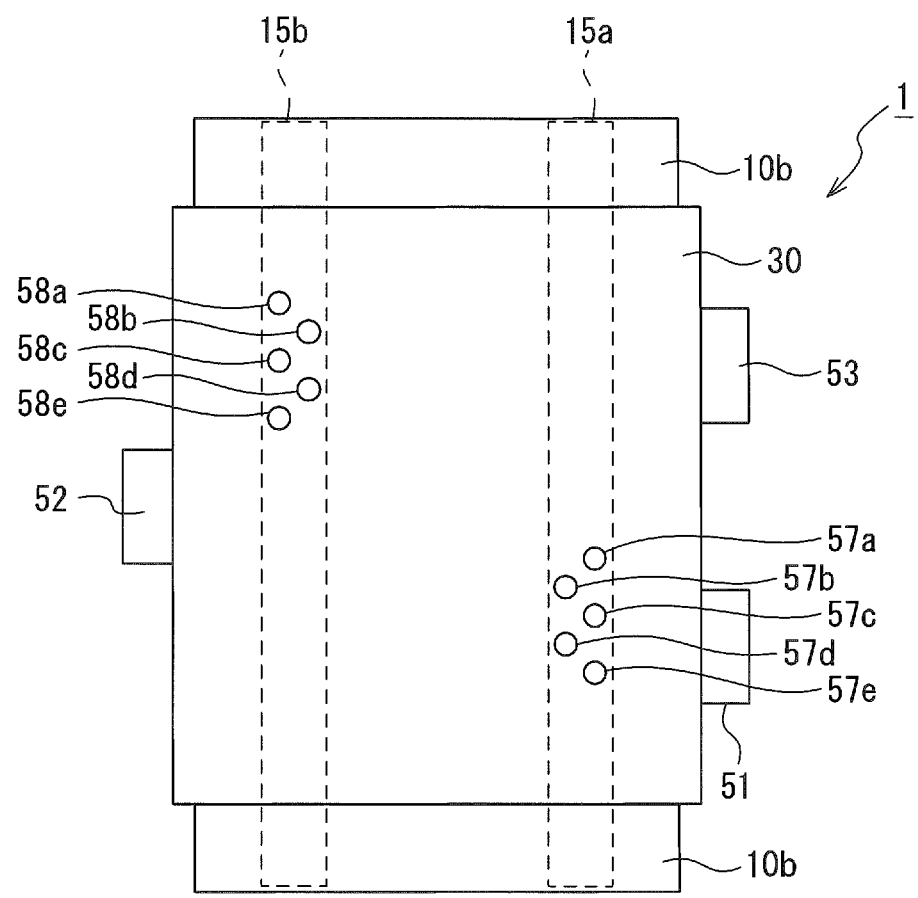
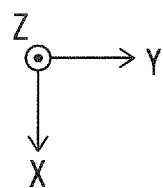

SEMICONDUCTOR DEVICE, COOLING MODULE, POWER CONVERTING DEVICE, AND ELECTRIC VEHICLE

CROSS-REFERENCE TO RELATED APPLICATION

This application claims benefit of priority under 35 USC 119 based on Japanese Patent Application No. 2018-103969 filed on May 30, 2018, the entire contents of which are incorporated by reference herein.

BACKGROUND OF THE INVENTION

1. Field of the Invention

The present invention relates to a semiconductor device, a cooling module for cooling a semiconductor element included in the semiconductor device, a power converting device including the semiconductor device, and an electric vehicle including the power converting device.

2. Description of the Related Art

Power semiconductor devices are used in motor-drive controlling inverters for elevators, for example, as industrial purposes. Power semiconductor devices have been widely used also in motor-drive controlling inverters for vehicles or DC-DC converters, for example. The power semiconductor devices are required to have a reduced size, high output power, and long-term reliability.

Such a power semiconductor device includes a power semiconductor module, and a cooling device for releasing heat from the power semiconductor module. The power semiconductor module is a semiconductor device including one or more semiconductor elements to implement partial or entire connection for conversion. The respective semiconductor elements included in the power semiconductor module are electrically connected to a control circuit outside the module via main terminals and control terminals. The power semiconductor device preferably has an electrically-insulating structure, excluding the main terminals and the control terminals, to avoid a short circuit.

The power semiconductor device is essentially required to release heat from the semiconductor elements more efficiently, as the power semiconductor device has a smaller size and higher output power. JP 2002-026469A discloses a circuit board including a ceramic substrate with which a coolant is in contact on the rear side, and a circuit pattern arranged on the front side of the ceramic substrate. JP 2008-103623A discloses a semiconductor device including a pair of lead frames interposing a semiconductor element, a resin for sealing the semiconductor element and the lead frames with the respective outer surfaces of the lead frames exposed, and ceramic tubes bonded to the respective outer surfaces of the lead frames.

JP 2002-026469A does not disclose a configuration regarding the main terminals and the control terminals connecting the semiconductor elements to the control circuit outside the module. While JP 2008-103623A discloses that signal terminals are connected to the semiconductor element via a wire bonding and are exposed to the outside between the ceramic tubes opposed to each other, such a configuration reduces the possibility of design of the wire-leading position, which prevents a reduction in size and complicates the wiring design.

SUMMARY OF THE INVENTION

In response to the above issue, the present invention provides a semiconductor device reduced in size and having a configuration capable of expanding the possibility of design of a wire-leading position and facilitating a wiring design, a cooling module for cooling semiconductor elements included in the semiconductor device, a power converting device including the semiconductor device, and an electric vehicle including the power converting device.

An aspect of the present invention discloses a semiconductor device encompassing: a first cooling device including a plurality of first flow channels through which a fluid flows, between a first main surface and a second main surface opposed to each other; a second cooling device including a plurality of second flow channels through which a fluid flows, between a third main surface and a fourth main surface parallel to the first main surface; a semiconductor element interposed between the first main surface and the third main surface facing each other; and a control terminal penetrating from the third main surface to the fourth main surface in a terminal-penetrating region defined at a predetermined position between the plurality of second flow channels, and electrically connected to a control electrode of the semiconductor element.

Another aspect of the present invention discloses a cooling module encompassing: a first cooling device including a plurality of first flow channels through which a fluid flows, between a first main surface and a second main surface opposed to each other; and a second cooling device including a plurality of second flow channels through which a fluid flows, between a third main surface and a fourth main surface parallel to the first main surface, wherein a terminal-penetrating region is defined in the second cooling device through which a control terminal, which is electrically connected to a control electrode of a semiconductor element interposed between the first main surface and the third main surface facing each other, penetrates from the third main surface to the fourth main surface at a predetermined position between the plurality of second flow channels.

Still another aspect of the present invention discloses a power converting device encompassing: a first cooling device including a plurality of first flow channels through which a fluid flows, between a first main surface and a second main surface opposed to each other; a second cooling device including a plurality of second flow channels through which a fluid flows, between a third main surface and a fourth main surface parallel to the first main surface; a semiconductor element interposed between the first main surface and the third main surface facing each other; a control terminal penetrating from the third main surface to the fourth main surface in a terminal-penetrating region defined at a predetermined position between the plurality of second flow channels, and electrically connected to a control electrode of the semiconductor element; a control substrate on which a circuit electrically connected to the control terminal is mounted; and a capacitor arranged toward the second main surface of the first cooling device.

Still another aspect of the present invention discloses an electric vehicle encompassing: a first cooling device including a plurality of first flow channels through which a fluid flows, between a first main surface and a second main surface opposed to each other; a second cooling device including a plurality of second flow channels through which a fluid flows, between a third main surface and a fourth main surface parallel to the first main surface; a semiconductor element interposed between the first main surface and the third main surface facing each other; a control terminal penetrating from the third main surface to the fourth main surface in a terminal-penetrating region defined at a predetermined position between the plurality of second flow channels, and electrically connected to a control electrode of the semiconductor element; a control substrate on which a circuit electrically connected to the control terminal is mounted; a capacitor arranged toward the second main surface of the first cooling device; a power source for supplying electricity to the semiconductor element; and a load driven by the semiconductor element.

BRIEF DESCRIPTION OF THE DRAWINGS

FIG. 12 is a top view illustrating a semiconductor device according to a first modified example of the embodiment of the present invention;

DETAILED DESCRIPTION

Figure 1:
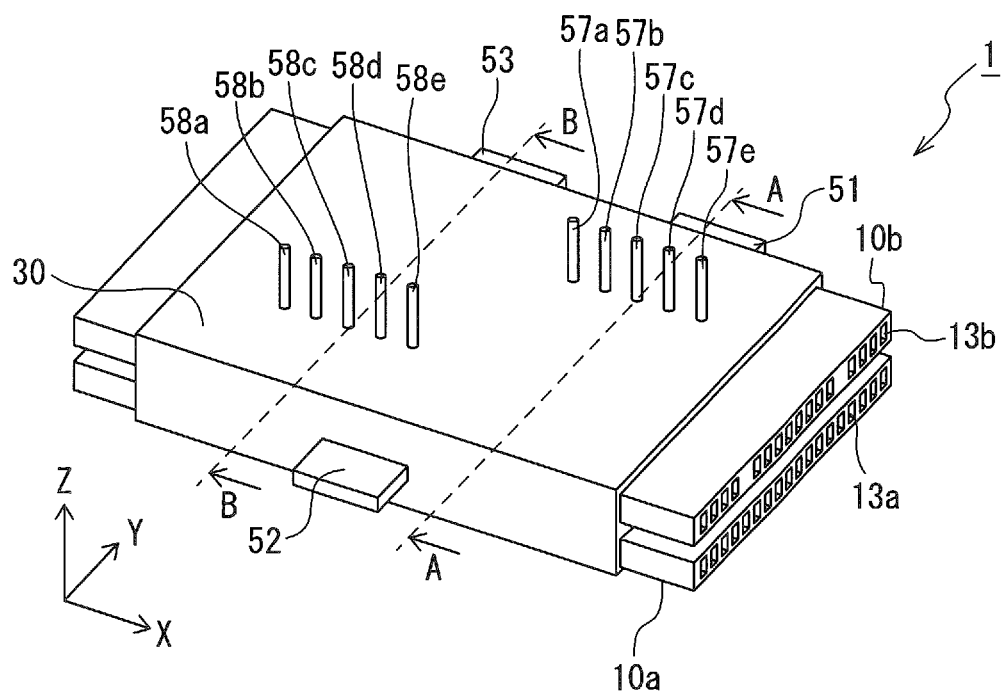
FIG. 1 is a perspective view illustrating a fundamental configuration of a semiconductor device according to an embodiment of the present invention.

With reference to the drawings, embodiments of the present invention will be explained in detail below. In the following description of the drawings, the same or similar reference numerals are assigned to the same or similar portions. The drawings are schematic, and it should be noted that the relationship between thickness and planar dimensions, the thickness proportion of each layer, and the like are different from real ones. Accordingly, specific thicknesses or dimensions should be determined with reference to the following description. Moreover, in some drawings, portions are illustrated with different dimensional relationships and proportions.

Further, definitions of directions such as an up-and down direction in the following description are merely definitions for convenience of understanding, and are not intended to limit the technical ideas of the present invention. For example, as a matter of course, when the subject is observed while being rotated by 90°, the subject is understood by converting the up-and-down direction into the right-and-left direction. When the subject is observed while being rotated by 180°, the subject is understood by inverting the up-and-down direction.

(Semiconductor Device)

A semiconductor device (a semiconductor module) 1 according to an embodiment of the present invention includes a first cooling device 10a provided with a plurality of first flow channels 13a, and a second cooling device 10b provided with a plurality of second flow channels 13b and arranged on the top surface side of the first cooling device 10a, as illustrated in FIG. 1. FIG. 1 illustrates the respective first flow channels 13a and second flow channels 13b extending in parallel to each other and aligned in a direction perpendicular to the extending direction. Each of the first flow channels 13a and the second flow channels 13b has open ends on both sides in the extending direction.

According to the embodiment of the present invention, as illustrated in FIG. 1, a longitudinal direction of the first flow channels 13a and the second flow channels 13b is defined as an X-axis direction (a first direction), a direction perpendicular to the X-axis direction, in which the respective first flow channels 13a and second flow channels 13b are aligned, is defined as a Y-direction (a second direction), and a direction perpendicular to the X-axis direction and the Y-axis direction is defined as a Z-axis direction. FIG. 1 and the other drawings use a right-handed XYZ coordinate system for illustration purposes. As used in the Specification, the term "planar view" refers to a case in which the top surface of the second cooling device 10b is viewed in the positive direction of the Z axis.

The circumference of the first cooling device 10a and the second cooling device 10b is substantially entirely covered with a sealing member 30, excluding the regions around the open ends. FIG. 1 illustrates a case in which a plurality of (ten) control terminals 57a, 57b, 57c, 57d, 57e, 58a, 58b, 58c, 58d, and 58e project from the sealing member 30 located on the top surface side of the second cooling device 10b. The control terminals 57a to 57e and 58a to 58e extend in the Z-axis direction, which is a longitudinal direction. The five control terminals 57a to 57e and the five control terminals 58a to 58e are separated from each other in the Y-axis direction, and are aligned in the X-axis direction.

The control terminals 57a to 57e and 58a to 58e may be cylindrical conductive pins, for example. The control terminals 57a to 57e and 58a to 58e are not limited to the cylindrical shape, and may each be a polygonal prism. The control terminals 57a to 57e and 58a to 58e are made of metal such as copper (Cu) or a Cu alloy. The control terminals 57a to 57e and 58a to 58e may be plated with metal or an alloy of nickel (Ni), tin (Sn), or gold (Au), for example.

The first cooling device 10a and the second cooling device 10b are made of an insulating material such as ceramics. An example of ceramics used as the insulating material may be a material having high heat conductivity, such as silicon carbide (SiC), silicon nitride ($Si_3N_4$), aluminum nitride (AlN), alumina ($Al_2O_3$), titania ($TiO_2$), or zirconia ($ZrO_2$). The first cooling device 10a and the second cooling device 10b may be made of the same material or different materials.

Figure 2:
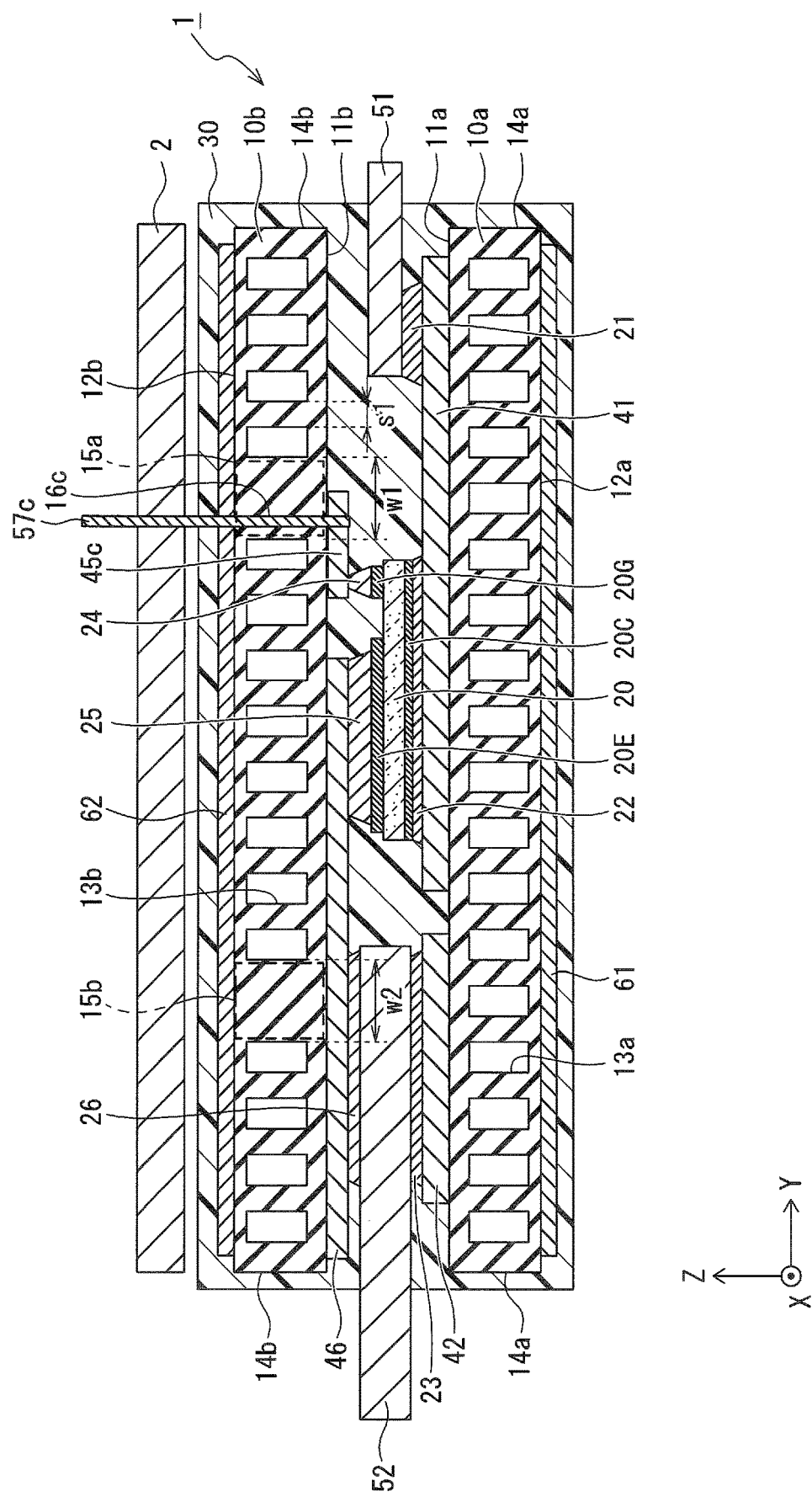
FIG. 2 is a cross-sectional view as viewed from direction A-A in FIG. 1.

FIG. 2 is a cross-sectional view as viewed from direction A-A in FIG. 1. As illustrated in FIG. 2, the first cooling device 10a has a first main surface (a top surface) 11a and a second main surface (a bottom surface) 12a opposed to each other. The first cooling device 10a may have a rectangular plate-like shape. The first cooling device 10a includes the plurality of first flow channels 13a through which a fluid serving as a coolant flows, between the first main surface 11a and the second main surface 12a. The fluid flowing through the respective first flow channels 13a may be liquid such as ethylene glycol aqueous solution or water, or gas such as air. Another example of the fluid flowing through the respective first flow channels 13a may be a phase-changeable coolant such as chlorofluorocarbon. The first cooling device 10a has two side surfaces 14a opposed to each other at both ends in the aligned direction of the first flow channels 13a (in the Y-axis direction). The plural first flow channels 13a are aligned in the direction parallel to the first main surface 11a. The size, the number, and the intervals of the first flow channels 13a may be determined as appropriate. For example, the respective first flow channels 13a have the common shape and are arranged at regular intervals.

The second cooling device 10b has a third main surface (a bottom surface) 11b and a fourth main surface (a top surface) 12b parallel to the first main surface and opposed to each other. The first main surface 11a of the first cooling device 10a and the third main surface 11b of the second cooling device 10b face each other. The second cooling device 10b may have a rectangular plate-like shape. The second cooling device 10b includes the plurality of second flow channels 13b through which a fluid serving as a coolant flows, between the third main surface 11b and the fourth main surface 12b. The coolant flowing through the respective second flow channels 13b may be the same as that flowing through the respective first flow channels 13a. The second cooling device 10b has two side surfaces 14b opposed to each other at both ends in the aligned direction of the second flow channels 13b (in the Y-axis direction). The plural second flow channels 13b are aligned in line in the direction parallel to the aligned direction of the first flow channels 13a.

The first main surface 11a of the first cooling device 10a and the third main surface 11b of the second cooling device 10b in the semiconductor device 1 may be parallel to each other. A first semiconductor element 20 and a second semiconductor element 70 (refer to FIG. 4) are arranged to be interposed between the first main surface 11a of the first cooling device 10a and the third main surface 11b of the second cooling device 10b. The first semiconductor element 20 has two main surfaces opposed to each other. One of the main surfaces of the first semiconductor element 20 is provided with a first main electrode 20E and a control electrode 20G, and the other main surface is provided with a second main electrode 20C. The second semiconductor element 70 has two main surfaces opposed to each other. One of the main surfaces of the second semiconductor element 70 is provided with a first main electrode 70E and a control electrode 70G, and the other main surface is provided with a second main electrode 70C.

The size, the number, and the intervals s1 of the respective second flow channels 13b may be determined as appropriate, and may be the same as or different from the size, the number, and the intervals of the respective first flow channels 13a. The respective second flow channels 13b have the common shape and are arranged substantially at regular intervals s1, at least at the portions in which the second flow channels 13b are provided.

The semiconductor device 1 according to the embodiment of the present invention includes regions in which the second flow channels 13b are intentionally not provided in the second cooling device 10b, at predetermined positions between the third main surface 11b and the fourth main surface 12b. The semiconductor device 1 according to the embodiment of the present invention employs the regions, as "terminal-penetrating regions 15a and 15b", in which the second flow channels 13b are not provided intentionally. The terminal-penetrating regions 15a and 15b extend in the X-axis direction parallel to the respective second flow channels 13b.

The terminal-penetrating region 15a is provided with a penetration hole 16c through which the control terminal 57c penetrates. The terminal-penetrating region 15a is further provided with penetration holes (not illustrated) through which the other control terminals 57a, 57b, 57d, and 57e illustrated in FIG. 1 penetrate. The terminal-penetrating region 15b is provided with penetration holes (not illustrated) through which the control terminals 58a to 58e illustrated in FIG. 1 penetrate. The width w1 of the terminal-penetrating region 15a and the width w2 of the terminal-penetrating region 15b defined in FIG. 2 are both wider than each interval s1 of the second flow channels 13b. The width w1 of the terminal-penetrating region 15a and the width w2 of the terminal-penetrating region 15b may be the same or different from each other.

FIG. 2 illustrates a case in which first conductive pattern layers 41 and 42 composing wiring circuits are bonded to the first main surface 11a of the first cooling device 10a. The first conductive pattern layers 41 and 42 include copper (Cu), and are bonded to the first main surface 11a of the first cooling device 10a by a direct copper bonding (DCB) method due to eutectic bonding or an activated metal brazing (AMB) method, for example. The first conductive pattern layers 41 and 42 are only required to include conductive metal, and may be Cu, a Cu alloy, aluminum (Al), or an Al alloy. The first conductive pattern layers 41 and 42 may be plated with nickel (Ni) or gold (Au).

One end of a first main terminal 51 is bonded to the top surface of the first conductive pattern layer 41 via a bonding material 21. The other end of the first main terminal 51 is exposed to the outside of the sealing member 30, and can be connected to a power source. The second main electrode 20C of the first semiconductor element 20 is also bonded and electrically connected to the top surface of the first conductive pattern layer 41 via a bonding material 22. One end of a second main terminal 52 is bonded to the top surface of the first conductive pattern layer 42 via a bonding material 23. The second main terminal 52 extends in the horizontal direction (in the Y-axis direction). The other end of the second main terminal 52 is exposed to the outside of the sealing member 30, and can be connected to a load such as a motor.

The first main terminal 51 and the second main terminal 52 may each be a conductive plate or a conductive stick made of metal such as Cu or a Cu alloy. The first main terminal 51 and the second main terminal 52 may be plated with Ni or Au, for example. The bonding materials 21, 22, and 23 may each be a solder, an electrically-conductive adhesive, or a metal sintered body such as nanoparticles of silver (Ag), for example.

FIG. 2 illustrates a plurality of second conductive pattern layers 45c and 46 bonded to the third main surface 11b of the second cooling device 10b. The second conductive pattern layers 45c and 46 are bonded to the second cooling device 10b by a DCB method due to eutectic bonding or an AMB method, for example, as in the case of the first conductive pattern layers 41 and 42. The second conductive pattern layers 45c and 46 are only required to include conductive metal, and may be Cu, a Cu alloy, Al, or an Al alloy. The second conductive pattern layers 45c and 46 may be plated with Ni or Au.

For example, one end of the second conductive pattern layer 46 is bonded and electrically connected to the first main electrode 20E of the first semiconductor element 20 via a bonding material 25. The other end of the second conductive pattern layer 46 is bonded to one end of the second main terminal 52 via a bonding material 26. One end of the second conductive pattern layer 45c is bonded and electrically connected to the control electrode 20G of the first semiconductor element 20 via a bonding material 24. The other end of the second conductive pattern layer 45c, which is separated from the part bonded to the control electrode 20G, is connected to the control terminal 57c. The other end of the second conductive pattern layer 45c connected to the control terminal 57c is located in the terminal-penetrating region 15a of the second cooling device 10b. The bonding materials 24, 25, and 26 may be a solder, an electrically-conductive adhesive, or a metal sintered body such as Ag nanoparticles, for example. The bonding material 24 may be an electrically-conductive bump or a solder ball.

The control terminal 57c extends in the normal direction of the first main surface 11a (in the Z-axis direction), and penetrates from the third main surface 11b to the fourth main surface 12b in the second cooling device 10b within the terminal-penetrating region 15a in which the second flow channels 13b of the second cooling device 10b are not provided. The control terminal 57c may extend above the fourth main surface 12b of the second cooling device 10b to project to the outside of the sealing member 30 so as to be connected to a control substrate 2. The control substrate 2 may be arranged above the semiconductor device 1 using screws (not illustrated). A circuit electrically connected to the control terminal 57c is mounted on the control substrate 2. The control substrate 2 supplies a control signal to the control electrode 20G of the first semiconductor element 20 via the control terminal 57c. The other control terminals 57a, 57b, 57d, and 57e illustrated in FIG. 1 may also penetrate the terminal-penetrating region 15a illustrated in FIG. 2 so as to be connected to the control substrate 2, in the same manner as the control terminal 57c.

Figure 3A:
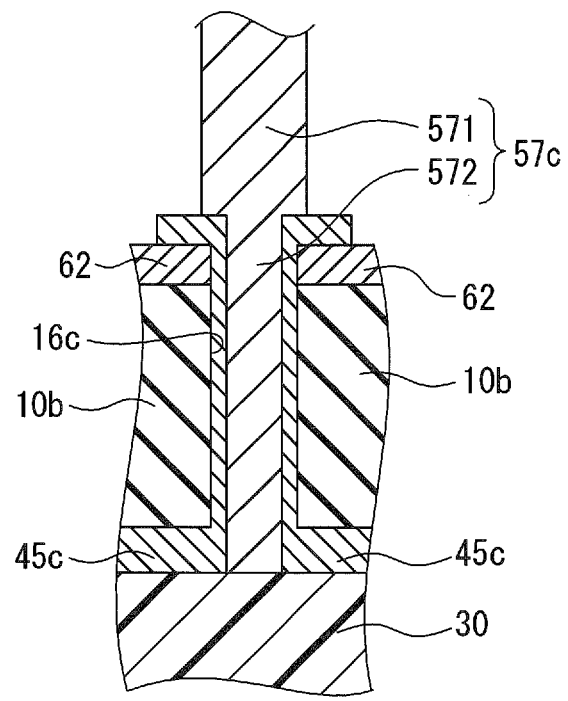
FIG. 3A is a partly-enlarged cross-sectional view of FIG. 2 as an example.

FIG. 3A is a partly-enlarged view around the lower end portion of the control terminal 57c illustrated in FIG. 2. As illustrated in FIG. 3A, the second conductive pattern layer 45c is continuously provided along the inside of the penetration hole 16c of the second cooling device 10b from the third main surface 11b of the second cooling device 10b so as to define the side wall surface of the penetration hole 16c through which the control terminal 57c penetrates. The second conductive pattern layer 45c further projects onto the top surface of a second buffer film 62 on the fourth main surface 12b side of the second cooling device 10b through the side wall of the penetration hole 16c of the second cooling device 10b. The second conductive pattern layer 45c provided along the side wall of the penetration hole 16c of the second cooling device 10b defines the penetration hole into which the control terminal 57c can be inserted.

Figure 3B:
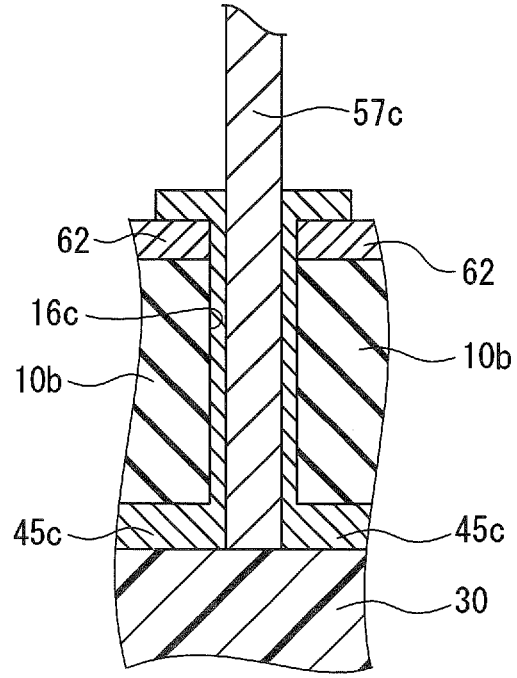
FIG. 3B is a partly-enlarged cross-sectional view of FIG. 2 as another example.

The control terminal 57c is a stepped pin including a first part 571 on the second substrate 2 side and a second part 572 connected to the first part 571 and narrower than the first part 571, for example. The control terminal 57c is not limited to this shape, and is only required to be fixed while being in contact with the second conductive pattern layer 45c. For example, as illustrated in FIG. 3B, the control terminal 57c may be a cylindrical pin or a polygonal prism-like pin having a constant thickness with no step. The control terminal 57c having such a shape is also inserted in the second cooling device 10b in the early stage of the manufacturing process, for example, so as to be positioned appropriately in the thickness direction.

A semiconductor chip composing the first semiconductor element 20 illustrated in FIG. 2 may have a rectangular plate-like shape, for example. The first semiconductor element 20 is made of a material such as silicon (Si), SiC, or gallium nitride (GaN). The first semiconductor element 20 may be a transistor such as a bipolar junction transistor (BJT), a field-effect transistor (FET), or a static induction transistor (SIT). Alternatively, the first semiconductor element 20 may be a semiconductor switching element such as an insulated-gate bipolar transistor (IGBT), a static induction thyristor (SI thyristor), or a gate turn-off thyristor (GTO). The first semiconductor element 20 may include a plurality of semiconductor elements, or may be a monolithic power integrated circuit (IC) including a diode such as Schottky barrier diode, or an IC or a module having a hybrid structure. The first semiconductor element 20 may be a reverse conducting IGBT (RC-IGBT) in which an IGBT as a switching element and a freewheeling diode (FWD) as a protection diode for the IGBT are formed on the same semiconductor chip.

When the first semiconductor element 20 is a BJT, the first main electrode refers to either an emitter electrode or a collector electrode, the second main electrode refers to the other electrode, and the control electrode refers to a base electrode. When the first semiconductor element 20 is a FET, for example, the first main electrode refers to either a source electrode or a drain electrode, the second main electrode refers to the other electrode, and the control electrode refers to a gate electrode. When the first semiconductor element 20 is a SI thyristor, for example, the first main electrode refers to either an anode or a cathode, the second main electrode refers to the other electrode, and the control electrode refers to a gate electrode.

The first semiconductor element 20 has two main surfaces (chip surfaces) opposed to each other. The respective main surfaces (the respective chip surfaces) of the first semiconductor element 20 are opposed to the first main surface 11a and the third main surface 11b via at least a part of the respective first conductive pattern layers 41 and 42 and at least a part of the respective second conductive pattern layers 45c and 46. The first semiconductor element 20 has a vertical structure in which the first main electrode (the emitter electrode) 20E and the second main electrode (the collector electrode) 20C are placed on the respective main surfaces (the respective chip surfaces) opposed to each other, for example. The first semiconductor element 20 may have a structure including the control electrode (the gate electrode) 20G arranged on the same main surface (the chip surface) on which the first main electrode 20E is placed.

The second main electrode 20C located on the bottom surface of the first semiconductor element 20 is bonded to the first conductive pattern layer 41 via the bonding material 22. The first main electrode 20E located on the top surface of the first semiconductor element 20 is bonded to the second conductive pattern layer 46 via the bonding material 25. When the first semiconductor element 20 has the structure including the control electrode 20G arranged on the same main surface (the same chip surface) as the first main electrode 20E, the control electrode 20G located on the top surface of the first semiconductor element 20 is bonded to the second conductive pattern layer 45c via the bonding material 24.

The second flow channels 13b of the second cooling device 10b are located at least at a position overlapping with the first main electrode 20E of the first semiconductor element 20 arranged on the same main surface as the control electrode 20G, in the aligned direction of the second flow channels 13b (in the Y-axis direction) in the planar view. The respective terminal-penetrating regions 15a and 15b are located on the outer side of the position overlapping with the first main electrode 20E in the aligned direction of the second flow channels 13b (in the Y-axis direction) in the planar view.

Since heat generated from the first semiconductor element 20 is released by the coolant flowing through the first cooling device 10a and the second cooling device 10b arranged toward the respective main surfaces of the first semiconductor element 20, the cooling performance is improved as compared with a case in which the cooling device is arranged only on one surface of the first semiconductor element 20.

A first buffer film 61 may be bonded to the second main surface 12a, which is the bottom surface of the first cooling device 10a, located on the lower side in FIG. 2. The first buffer film 61 bonded to the second main surface 12a connects the second main surface 12a and the sealing member 30 between one end and the other end in the aligned direction of the first flow channels 13a. A second buffer film 62 may be bonded to the fourth main surface 12b, which is the top surface of the second cooling device 10b, located on the upper side in FIG. 2. The second buffer film 62 bonded to the fourth main surface 12b connects the fourth main surface 12b and the sealing member 30 between one end and the other end in the aligned direction of the second flow channels 13b.

The first buffer film 61 and the second buffer film 62 illustrated in FIG. 2 each may be a single film or may be divided into parts. The thickness of the first buffer film 61 and the second buffer film 62 can be preferably 0.1 millimeters or greater and 5.0 millimeters or less, more preferably 0.2 millimeters or greater and 2.5 millimeters or less.

When the material used for the first cooling device 10a and the second cooling device 10b is ceramics, for example, the material used for the first buffer film 61 and the second buffer film 62 is preferably metal having a higher thermal expansion coefficient than ceramics. The first buffer film 61 and the second buffer film 62 include Cu or a Cu alloy, for example, and are bonded to the second main surface 12a and the fourth main surface 12b by a DCB method due to eutectic bonding or an AMB method, for example. The first buffer film 61 and the second buffer film 62 may be made of the same material as the first conductive pattern layers 41 and 42 and the second conductive pattern layers 45c and 46. Alternatively, the first buffer film 61 and the second buffer film 62 may include Al or an Al alloy, Ni or a Ni alloy, or stainless steel, for example, instead of Cu or the Cu alloy. The first buffer film 61 and the second buffer film 62 may also be plated with Ni or Au, for example.

The first buffer film 61 and the second buffer film 62 may have slits on the respective surfaces adhering to the sealing member 30. The slits may be provided in parallel to the longitudinal direction of the first flow channels 13a and the second flow channels 13b, for example. The slits may be grooves carved on the surfaces of the first buffer film 61 and the second buffer film 62, or may penetrate from the front side to the rear side of the first buffer film 61 and the second buffer film 62. The slits having an anchoring effect improve the adhesion of the first buffer film 61 and the second buffer film 62 to the sealing member 30.

The sealing member 30 seals the first semiconductor element 20, the first conductive pattern layers 41 and 42, and the second conductive pattern layers 45c and 46. The sealing member 30 includes thermosetting resin and filler. The thermosetting resin is epoxy resin or resin mainly containing epoxy resin, for example. The filler is powder of insulating inorganic material such as silica, for example.

The sealing member 30 is arranged to surround the circumferential surfaces of the first cooling device 10a and the second cooling device 10b in the cross-sectional view perpendicular to the longitudinal direction of the first flow channels 13a and the second flow channels 13b. The sealing member 30 has a cuboidal shape with two surfaces opposed to the second main surface 12a of the first cooling device 10a and the fourth main surface 12b of the second cooling device 10b.

Figure 4:
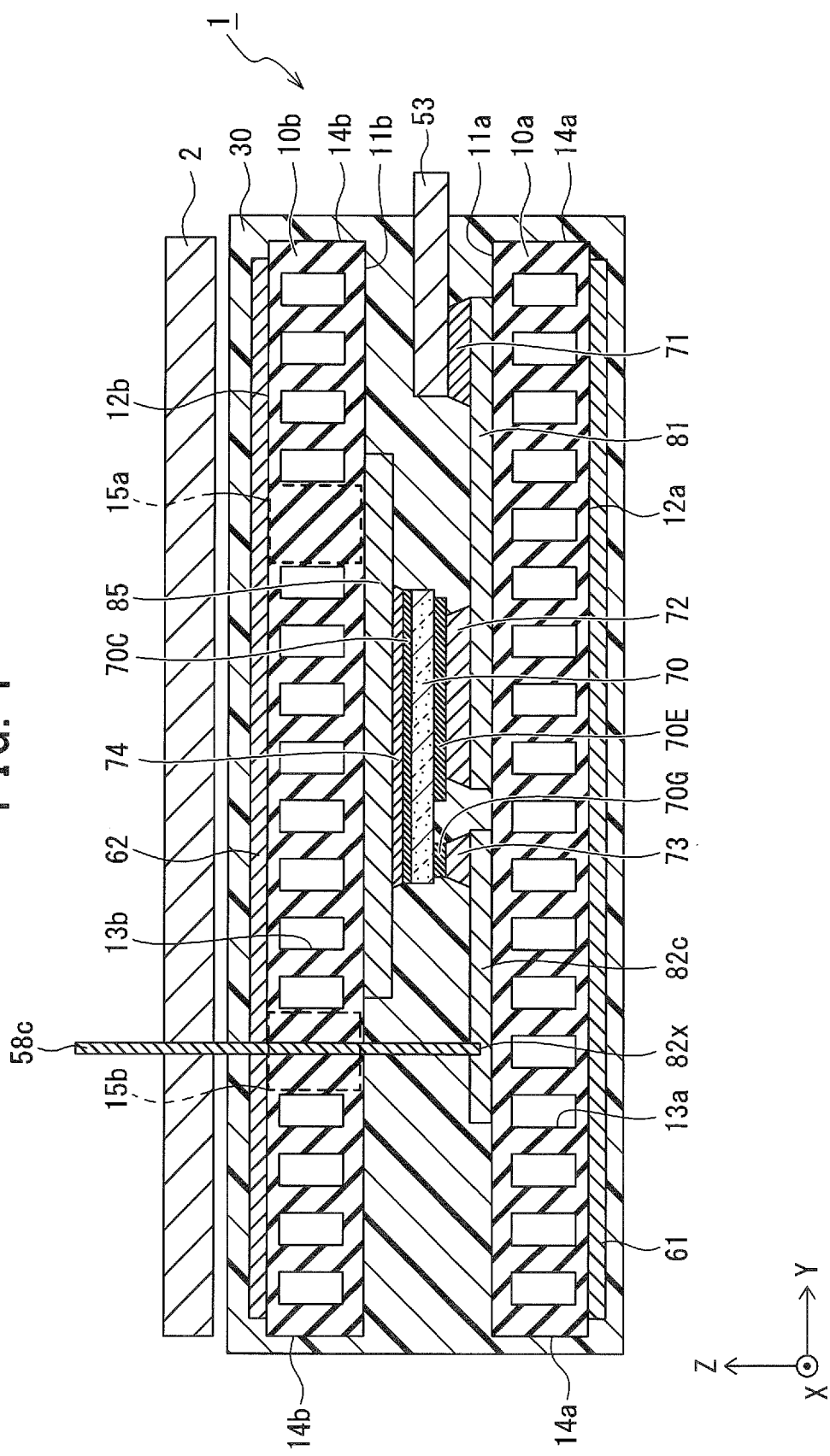
FIG. 4 is a cross-sectional view as viewed from direction B-B in FIG. 1.

FIG. 4 is a cross-sectional view as viewed from direction B-B in FIG. 1. As illustrated in FIG. 4, first conductive pattern layers 81 and 82c are bonded to the first main surface 11a of the first cooling device 10a. One end of a third main terminal 53 is bonded to the first conductive pattern layer 81 via a bonding material 71. The third main terminal 53 extends in the horizontal direction (in the Y-axis direction). The other end of the third main terminal 53 is exposed to the outside of the sealing member 30, and can be connected to the power source, for example. A second conductive pattern layer 85 is connected to the third main surface 11b of the second cooling device 10b. The second conductive pattern layer 85 is connected to the second conductive pattern layer 46 illustrated in FIG. 2 at a position on the front side in the direction perpendicular to the sheet of FIG. 4 (in the X-axis direction).

The semiconductor device 1 according to the embodiment of the present invention includes the second semiconductor element (the second semiconductor chip) 70 as illustrated in FIG. 4, in addition to the first semiconductor element 20 illustrated in FIG. 2. The semiconductor device 1 according to the embodiment of the present invention is thus a 2-in-1 power semiconductor module. The second semiconductor element 70 may have the same structure as the first semiconductor element 20. The second semiconductor element 70 has a vertically-inverted topology of the first semiconductor element 20. The second semiconductor element 70 includes the first main electrode 70E and the control electrode 70G on the bottom surface side, and the second main electrode 70C on the top surface side.

The second main electrode 70C located on the top surface of the second semiconductor element 70 is bonded to the second conductive pattern layer 85 via a bonding material 74. The second main electrode 70C of the semiconductor element composing the second semiconductor element 70 is thus connected to the first main electrode 20E of the semiconductor element composing the first semiconductor element 20. The first main electrode 70E located on the bottom surface of the second semiconductor element 70 is bonded to the first conductive pattern layer 81 via a bonding material 72. The control electrode 70G located on the bottom surface of the second semiconductor element 70 is bonded to one end of the first conductive pattern layer 82c via a bonding material 73.

The other end of the first conductive pattern layer 82c is provided with a recess 82x. A penetration hole penetrating the first conductive pattern layer 82c may be provided instead of the recess 82x. The control terminal 58c is inserted and bonded to the recess 82x of the first conductive pattern layer 82c. The control terminal 58c is bonded to the first conductive pattern layer 82c by pressure welding or with a bonding material such as a solder, for example.

The control terminal 58c extends in the normal direction of the first main surface 11a (in the Z-axis direction), and penetrates from the third main surface 11b to the fourth main surface 12b in the second cooling device 10b within the terminal-penetrating region 15b in which the second flow channels 13b of the second cooling device 10b are not provided. The control terminal 58c projects to the outside of the sealing member 30 above the fourth main surface 12b of the second cooling device 10b so as to be connected to the control substrate 2. The other control terminals 58a, 58b, 58d, and 58e illustrated in FIG. 1 also penetrate from the third main surface 11b to the fourth main surface 12b in the second cooling device 10b so as to be connected to the control substrate 2, in the same manner as the control terminal 58c.

Figure 5:
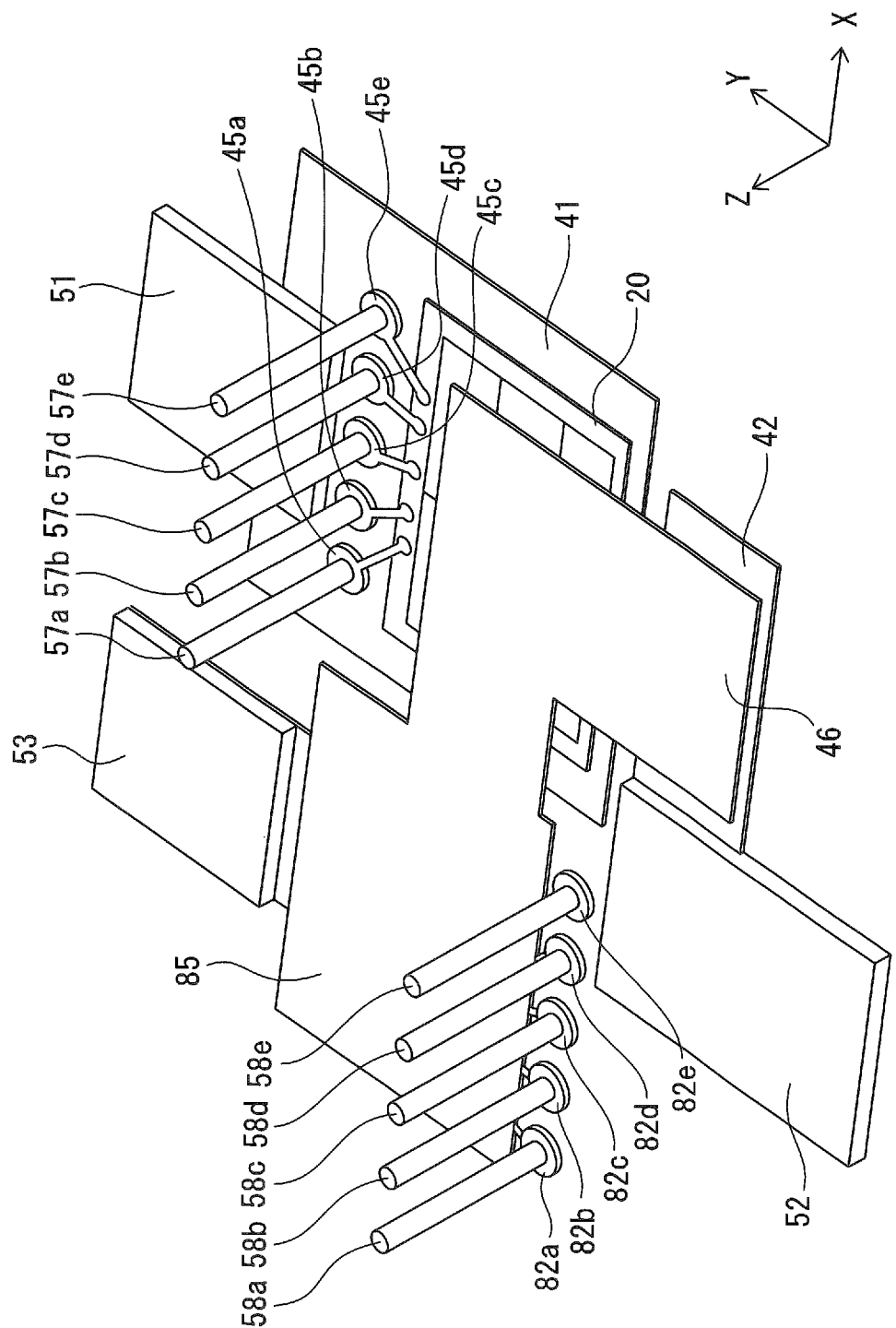
FIG. 5 is a perspective view omitting cooling devices and a sealing member illustrated in FIG. 1.
Figure 6:
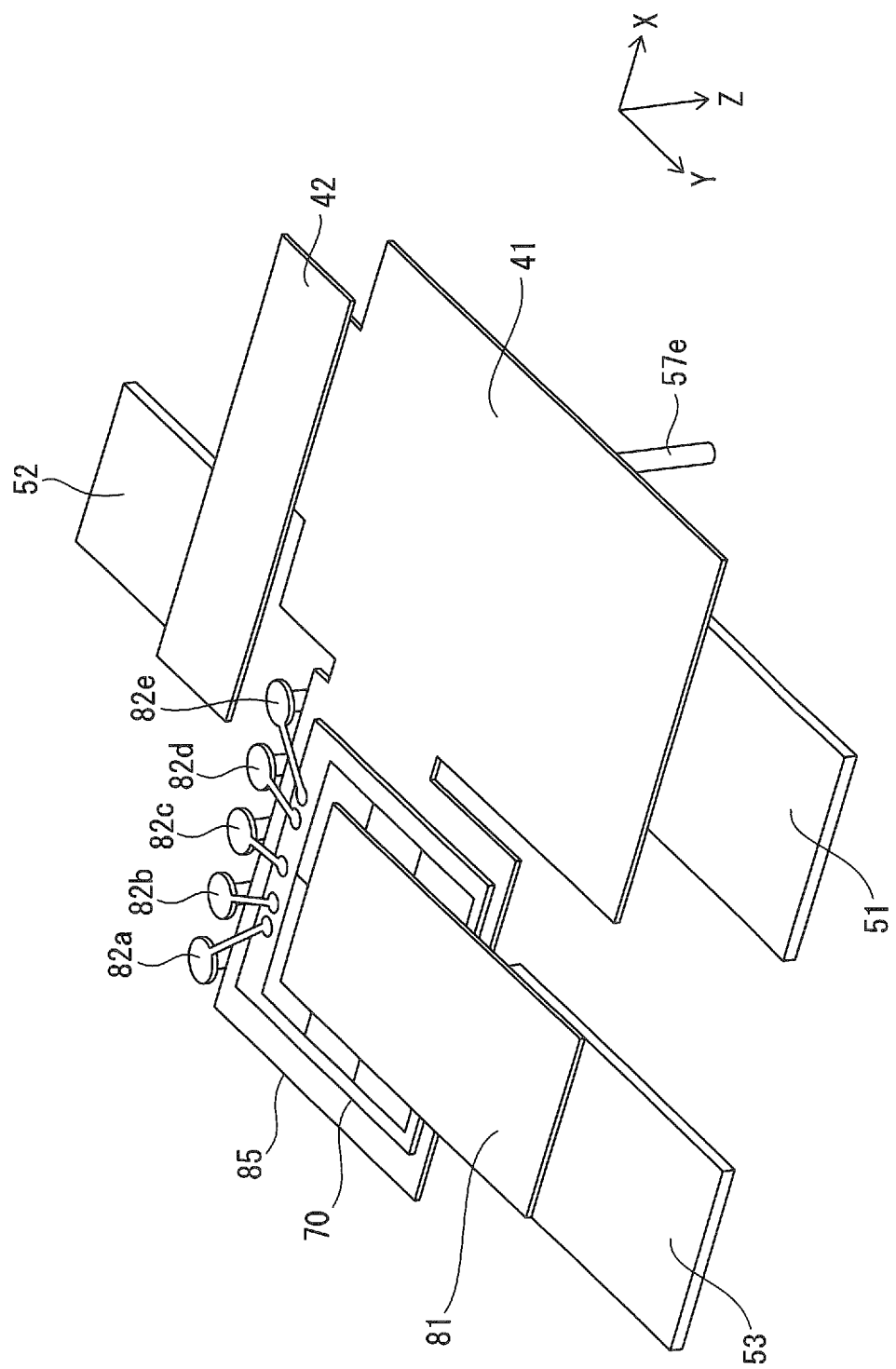
FIG. 6 is a vertically-inverted perspective view corresponding to FIG. 5.

FIG. 5 is a perspective view of the semiconductor device 1, omitting the first cooling device 10a, the second cooling device 10b, and the sealing member 30 illustrated in FIG. 1. FIG. 6 is an inverted perspective view of FIG. 5 vertically inverted about a rotation axis in the X-axis direction. As illustrated in FIG. 5 and FIG. 6, the control terminals 57a, 57b, 57c, 57d, and 57e are respectively connected to the second conductive pattern layers 45a, 45b, 45c, 45d, and 45e. The second conductive pattern layers 45a to 45e each include a circular land bonded to the respective control terminals 57a to 57e, and a wiring part extending from the land and connected to the first semiconductor element 20. The lands and the wiring parts of the control terminals 57a to 57e may be provided in the terminal-penetrating region 15a of the second cooling device 10b.

The control terminals 58a, 58b, 58c, 58d, and 58e are respectively connected to the first conductive pattern layers 82a, 82b, 82c, 82d, and 82e. The first conductive pattern layers 82a to 82e each include a circular land bonded to the respective control terminals 58a to 58e, and a wiring part extending from the land and connected to the second semiconductor element 70. The lands and the wiring parts of the control terminals 58a to 58e may be provided in a region of the first cooling device 10a opposed to the terminal-penetrating region 15b of the second cooling device 10b.

Figure 7:
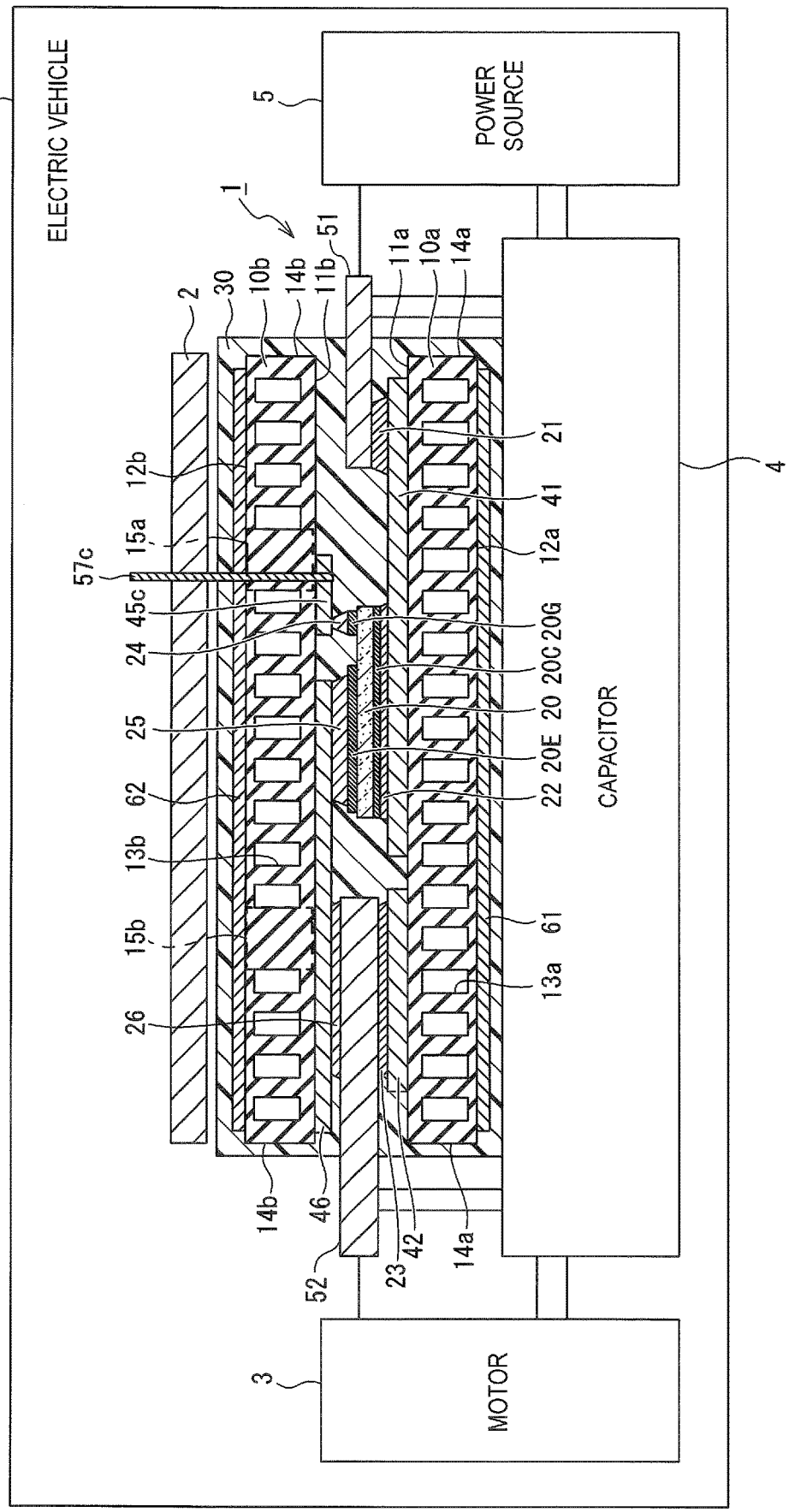
FIG. 7 is a schematic view illustrating a configuration of an electric vehicle employing the semiconductor device according to the embodiment of the present invention.

The semiconductor device 1 according to the embodiment of the present invention may be used for a power converting device for driving a motor 3 of an electric vehicle 100, as illustrated in FIG. 7. The power converting device for driving the motor 3 of the electric vehicle 100 includes the semiconductor device 1 and the control substrate 2 arranged above the semiconductor device 1. A capacitor 4 is placed on the bottom surface of the semiconductor device 1. The capacitor 4 may be a smoothing capacitor for stabilizing a DC voltage output from the converter, for example. The semiconductor device 1 and the capacitor 4 are connected to a power source 5. The semiconductor device 1 and the capacitor 4 are connected to a load such as the motor 3 to fabricate the electric vehicle 100. In a case of a three-phase inverter, the power converting device may be implemented by three 2-in-1 power semiconductor modules. The power converting device according to the embodiment of the present invention can cool the capacitor 4 arranged adjacent to the semiconductor device 1 by the first cooling device 10a of the semiconductor device 1.

Figure 26:
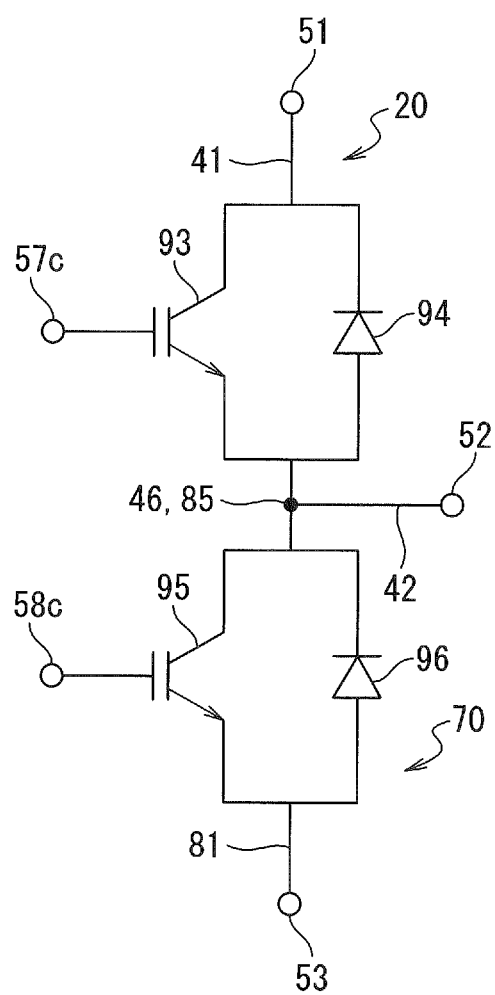
FIG. 26 is a circuit diagram illustrating the semiconductor device according to the embodiment of the present invention.

As illustrated in FIG. 26, the first semiconductor element 20, the second semiconductor element 70, the first conductive pattern layers 41, 42, and 81, the second conductive pattern layers 46 and 85, the first main terminal 51, the second main terminal 52, and the third main terminal 53 included in the semiconductor device 1, may be arranged and electrically connected to each other such that the first semiconductor element 20 and the second semiconductor element 70 are connected in series to implement a circuit (a leg). The first semiconductor element 20 and the second semiconductor element 70 of this example may each be a RC-IGBT.

The first semiconductor element 20 may include an IGBT 93 and a FWD 94. A gate of the IGBT 93 may be connected to the control terminal 57c. The second semiconductor element 70 may include an IGBT 95 and a FWD 96. A gate of the IGBT 95 may be connected to the control terminal 58c.

Figure 8:
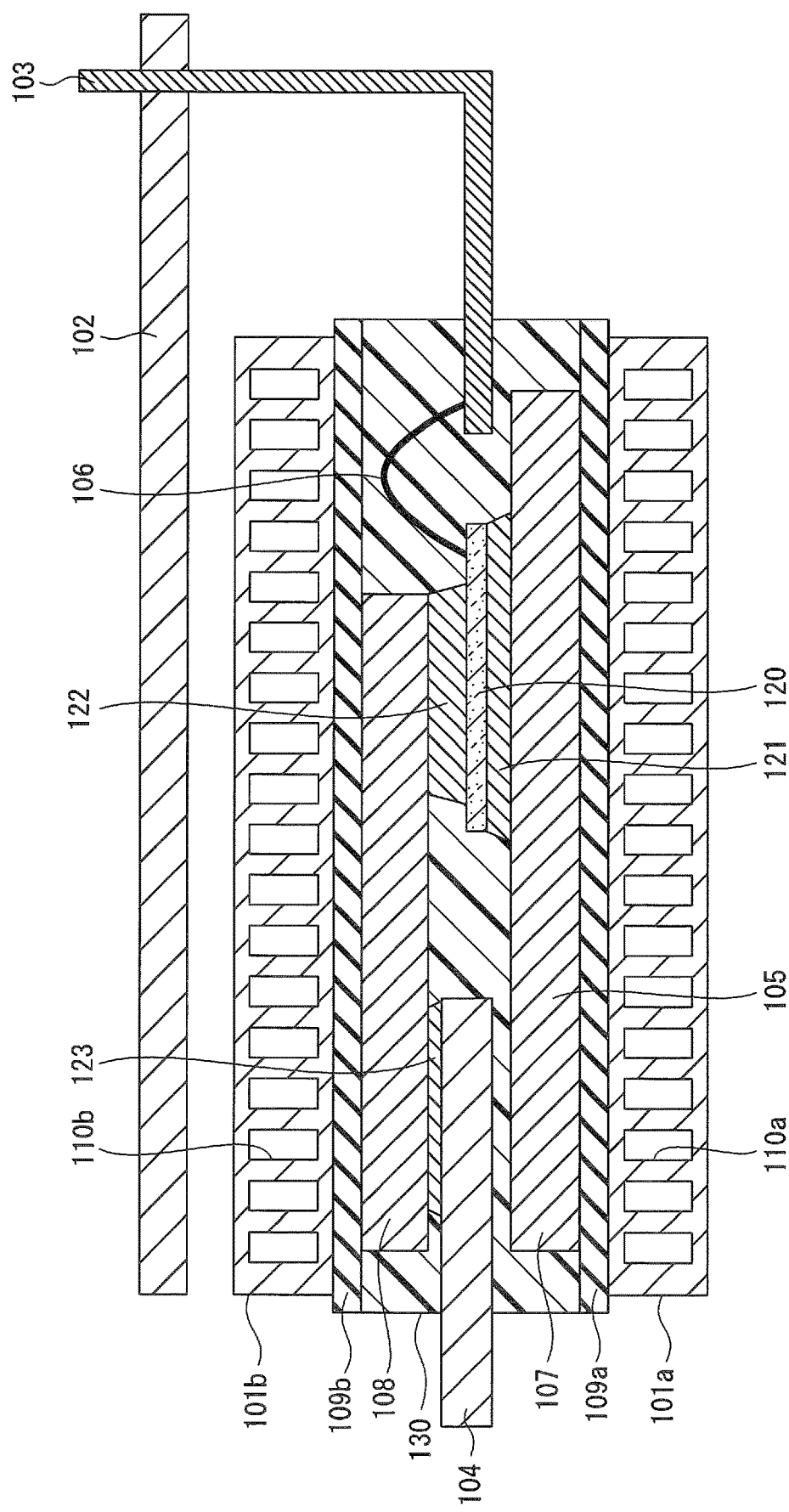
FIG. 8 is a cross-sectional view of a semiconductor device according to a comparative example.

A semiconductor device according to a comparative example is illustrated below with reference to FIG. 8. The semiconductor device according to the comparative example includes a first cooling device 101a provided with a plurality of first flow channels 110a, and a second cooling device 101b provided with a plurality of second flow channels 110b. The bottom surface of the second cooling device 101b is opposed to the top surface of the first cooling device 101a. A conductive pattern layer 107 is placed on the top surface of the first cooling device 101a via an insulating substrate 109a. The conductive pattern layer 107 is bonded to the bottom surface of a semiconductor element 120 via a bonding material 121. A conductive pattern layer 108 is placed on the bottom surface of the second cooling device 101b via an insulating substrate 109b. A main terminal 104 is bonded to one end of the conductive pattern layer 108 via a bonding material 123. The other end of the conductive pattern layer 108 is bonded to the top surface of the semiconductor element 120 via a bonding material 122. The semiconductor element 120 and the respective conductive pattern layers 107 and 108 are covered with a sealing resin 130.

The semiconductor element 120 is connected to a control terminal 103 via a bonding wire 106. The control terminal 103 extends parallel to the top surface of the first cooling device 101a, and projects to the outside of the sealing resin 130 between the first cooling device 101a and the second cooling device 101b. The control terminal 103 is bent into an L-shape outside the sealing resin 130, and extends in the normal direction of the top surface of the first cooling device 101a so as to be connected to a control substrate 102 arranged above the second cooling device 101b. Since the semiconductor device according to the comparative example includes the control terminal 103 extending in parallel to the top surface of the first cooling device 101a and projecting to the outside between the first cooling device 101a and the second cooling device 101b, the possibility of design of the wire-leading position is reduced. This prevents a reduction in size and complicates the wiring design.

In contrast, the semiconductor device 1 according to the embodiment of the present invention includes the control terminals 57a to 57e and 58a to 58e which extend in the normal direction of the first main surface 11a of the first cooling device 10a (in the Z-axis direction), and penetrate from the third main surface 11b to the fourth main surface 12b in the terminal-penetrating regions 15a and 15b defined at the predetermined positions between the plurality of second flow channels 13b. The control terminals 57a to 57e and 58a to 58e are led out from the fourth main surface 12b of the second cooling device 10b. The possibility of design of the wire-leading position of the respective control terminals 57a to 57e and 58a to 58e thus can be expanded. Accordingly, a reduction in size of the semiconductor device 1 according to the embodiment of the present invention can be achieved to facilitate the wiring design of the semiconductor device 1 and the power converting device including the semiconductor device 1.

(Method of Fabricating Semiconductor Device)

A method of fabricating the semiconductor device (the semiconductor module) 1 according to the embodiment of the present invention is illustrated below with reference to FIG. 1 and FIG. 9 to FIG. 11.

First, first conductive pattern layers composing circuit patterns such as the first conductive pattern layers 41 and 42, are formed on the first main surface 11a of the first cooling device 10a (refer to FIG. 2, for example). Also, second conductive pattern layers composing circuit patterns such as the second conductive pattern layers 45c and 46, are formed on the third main surface 11b of the second cooling device 10b (refer to FIG. 4, for example).

Next, the first semiconductor element 20 and the second semiconductor element 70 are mounted on the first conductive pattern layers of the first cooling device 10a so that the bottom surfaces of the first semiconductor element 20 and the second semiconductor element 70 are bonded via bonding materials (refer to FIG. 2 and FIG. 4, for example). Further, the first main terminal 51, the second main terminal 52, and the third main terminal 53 are bonded to the top surfaces of the first conductive pattern layers (refer to FIG. 2 and FIG. 4, for example). The conductive pattern layers composing the respective circuit patterns may be designed as appropriate depending on the type of the elements or circuits.

Figure 9:
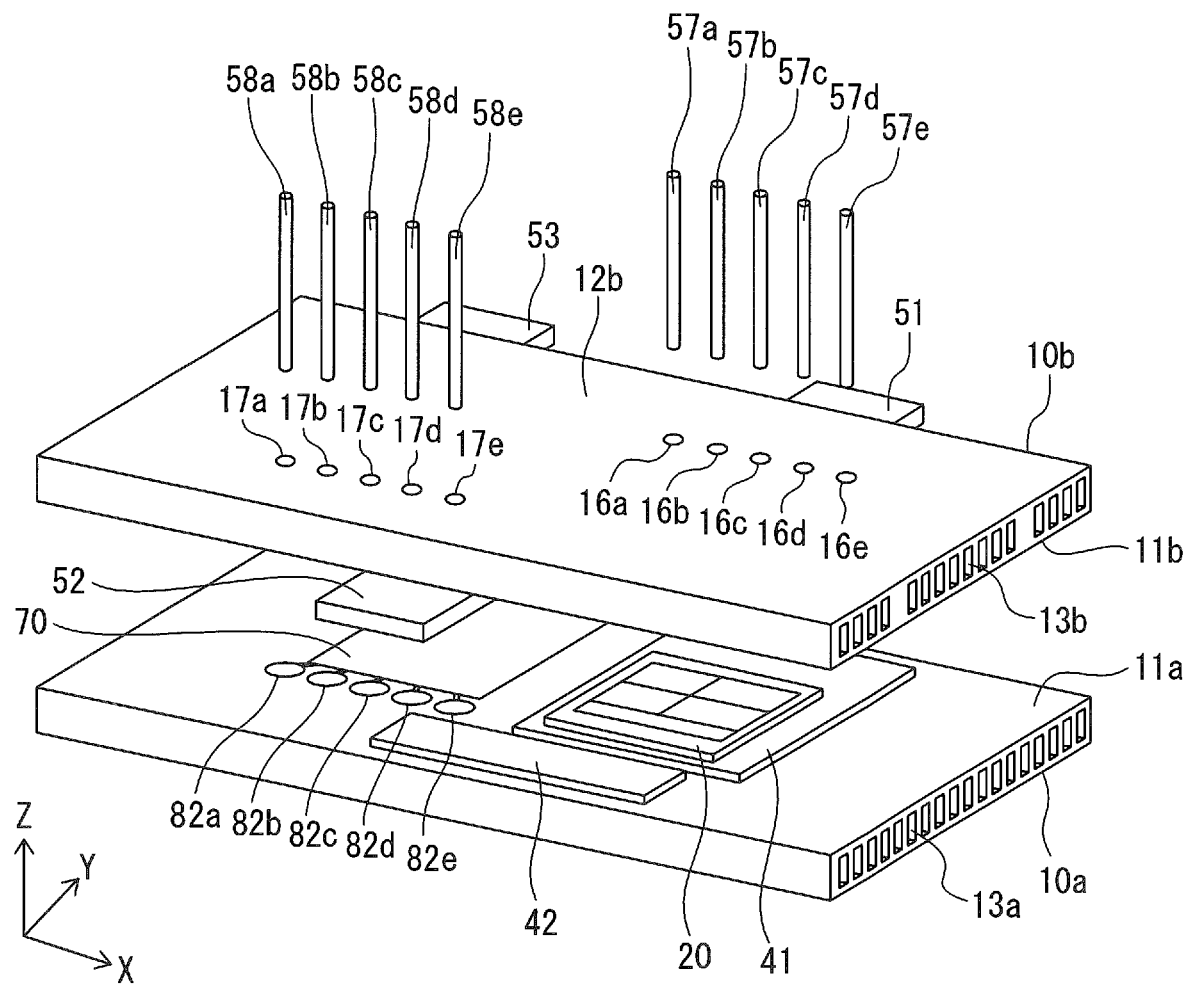
FIG. 9 is an explanatory view illustrating a process of fabricating the semiconductor device according to the embodiment of the present invention.

Next, as illustrated in FIG. 9, the first cooling device 10a and the second cooling device 10b are opposed and stacked to each other so that the first conductive pattern layers on the first main surface 11a of the first cooling device 10a and the second conductive pattern layers on the third main surface 11b of the second cooling device 10b correspond to each other. The second cooling device 10b is provided with penetration holes 16a, 16b, 16c, 16d, and 16e to which the control terminals 57a to 57e are inserted, and penetration holes 17a, 17b 17c, 17d, and 17e to which the control terminals 58a to 58e are inserted. The both main surfaces (the chip surfaces) of the respective first semiconductor element 20 and second semiconductor element 70 are interposed between the first main surface 11a of the first cooling device 10a and the third main surface 11b of the second cooling device 10b.

Figure 10:
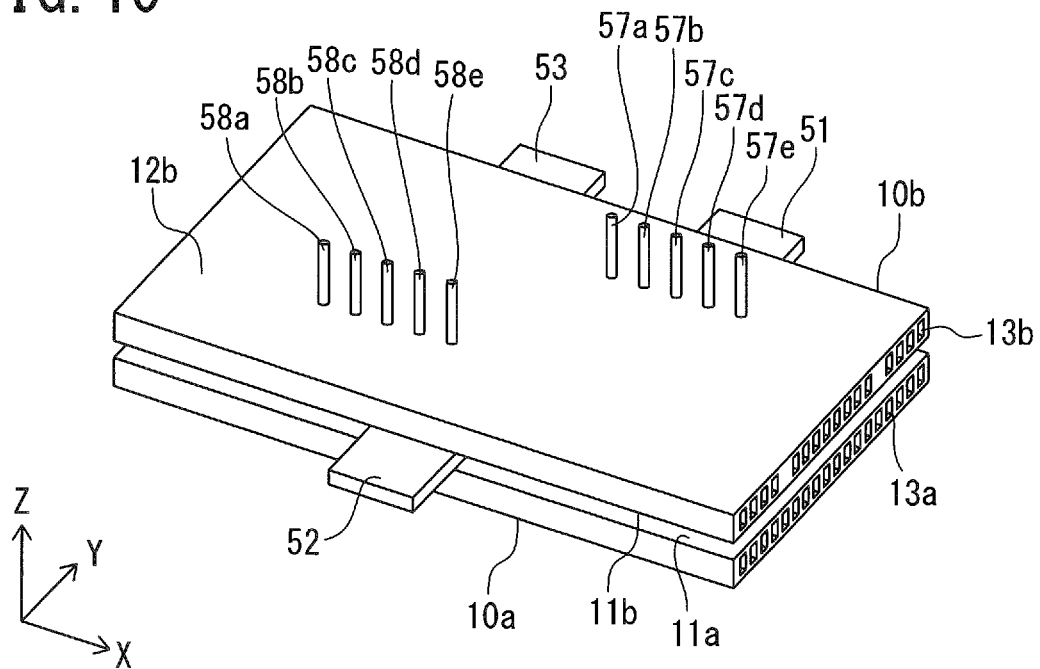
FIG. 10 is an explanatory view illustrating the process of fabricating the semiconductor device according to the embodiment of the present invention.

Next, as illustrated in FIG. 10, the first semiconductor element 20 and the second semiconductor element 70 are bonded to the first conductive pattern layers on the first main surface 11a of the first cooling device 10a and the second conductive pattern layers on the third main surface 11b of the second cooling device 10b. The first main terminal 51, the second main terminal 52, and the third main terminal 53 are arranged to project to the outside from both ends of the first cooling device 10a and the second cooling device 10b in the aligned direction of the first flow channels 13a and the second flow channels 13b (in the Y-axis direction). The control terminals 57a to 57e are inserted to the penetration holes 16a to 16e to be bonded to the second conductive pattern layers on the third main surface 11b of the second cooling device 10b, and the control terminals 58a to 58e are inserted to the penetration holes 17a to 17e to be bonded to the first conductive pattern layers on the first main surface 11a of the first cooling device 10a.

Thereafter, the first cooling device 10a, the second cooling device 10b, the first semiconductor element 20, and the second semiconductor element 70 are bonded together and placed inside a metal mold. The sealing member 30 before being solidified is injected to the metal mold and then solidified. Accordingly, the sealing member 30 covering the first cooling device 10a and the second cooling device 10b, excluding both ends of the respective first flow channels 13a and second flow channels 13b, is provided, as illustrated in FIG. 1. The respective end portions of the first flow channels 13a, the second flow channels 13b, the first main terminal 51, the second main terminal 52, and the third main terminal 53 project to be exposed to the outside from the surface of the sealing member 30.

Figure 11:
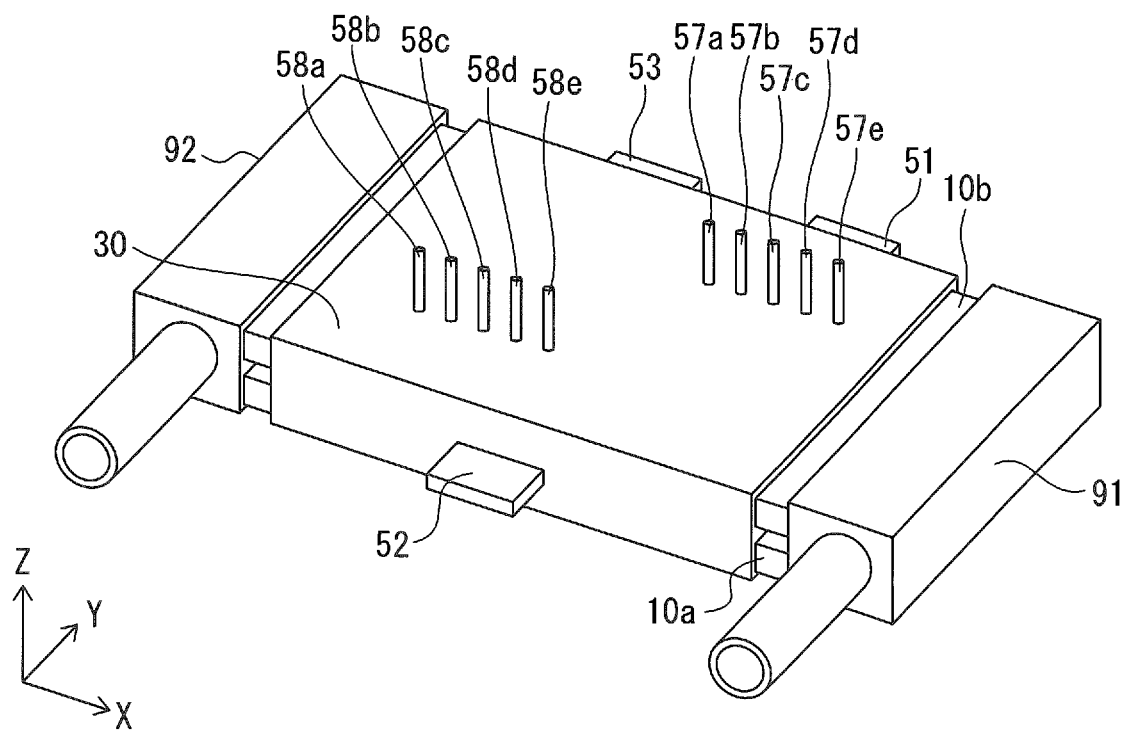
FIG. 11 is an explanatory view illustrating the process of fabricating the semiconductor device according to the embodiment of the present invention.

The semiconductor device 1 thus fabricated is connected with manifolds 91 and 92 at both ends of the first flow channels 13a and the second flow channels 13b of the first cooling device 10a and the second cooling device 10b (refer to FIG. 1) during the use, as illustrated in FIG. 11. The openings at both ends of the respective first flow channels 13a and second flow channels 13b (refer to FIG. 1) are connected to an external circulation system via the respective manifolds 91 and 92, so that a fluid serving as a coolant flows in the respective first flow channels 13a and second flow channels 13b in the same direction.

First Modified Example

As illustrated in FIG. 12, a semiconductor device 1 according to a first modified example of the embodiment of the present invention differs from the semiconductor device 1 according to the embodiment of the present invention, in that the control terminals 57a to 57e are arranged in two lines in the first semiconductor element 20 illustrated in FIG.

2, and the control terminals 58a to 58e are arranged in two lines in the second semiconductor element 70 illustrated in FIG. 4.

The control terminals 57a to 57e are arranged to penetrate the terminal-penetrating region 15a of the second cooling device 10b. The respective sets of the control terminals 57a, 57c, and 57e and the control terminals 57b and 57d aligned in the X-axis direction, are shifted from each other in the Y-axis direction. The control terminals 58a to 58e are arranged to penetrate the terminal-penetrating region 15b of the second cooling device 10b. The respective sets of the control terminals 58a, 58c, and 58e and the control terminals 58b and 58d aligned in the X-axis direction, are shifted from each other in the Y-axis direction. The semiconductor device 1 according to this example thus includes the four sets of the control terminals 57a, 57c, and 57e, the control terminals 57b and 57d, the control terminals 58a, 58c, and 58e, and the control terminals 58b and 58d, which are arranged in four lines in the X-axis direction.

The semiconductor device 1 according to the first modified example of the embodiment of the present invention includes the control terminals 57a to 57e and 58a to 58e of which the positions can be adjusted, so that the size and the positions of the terminal-penetrating regions 15a and 15b can also be adjusted depending on the positions of the control terminals 57a to 57e and 58a to 58e.

Second Modified Example

Figure 13:
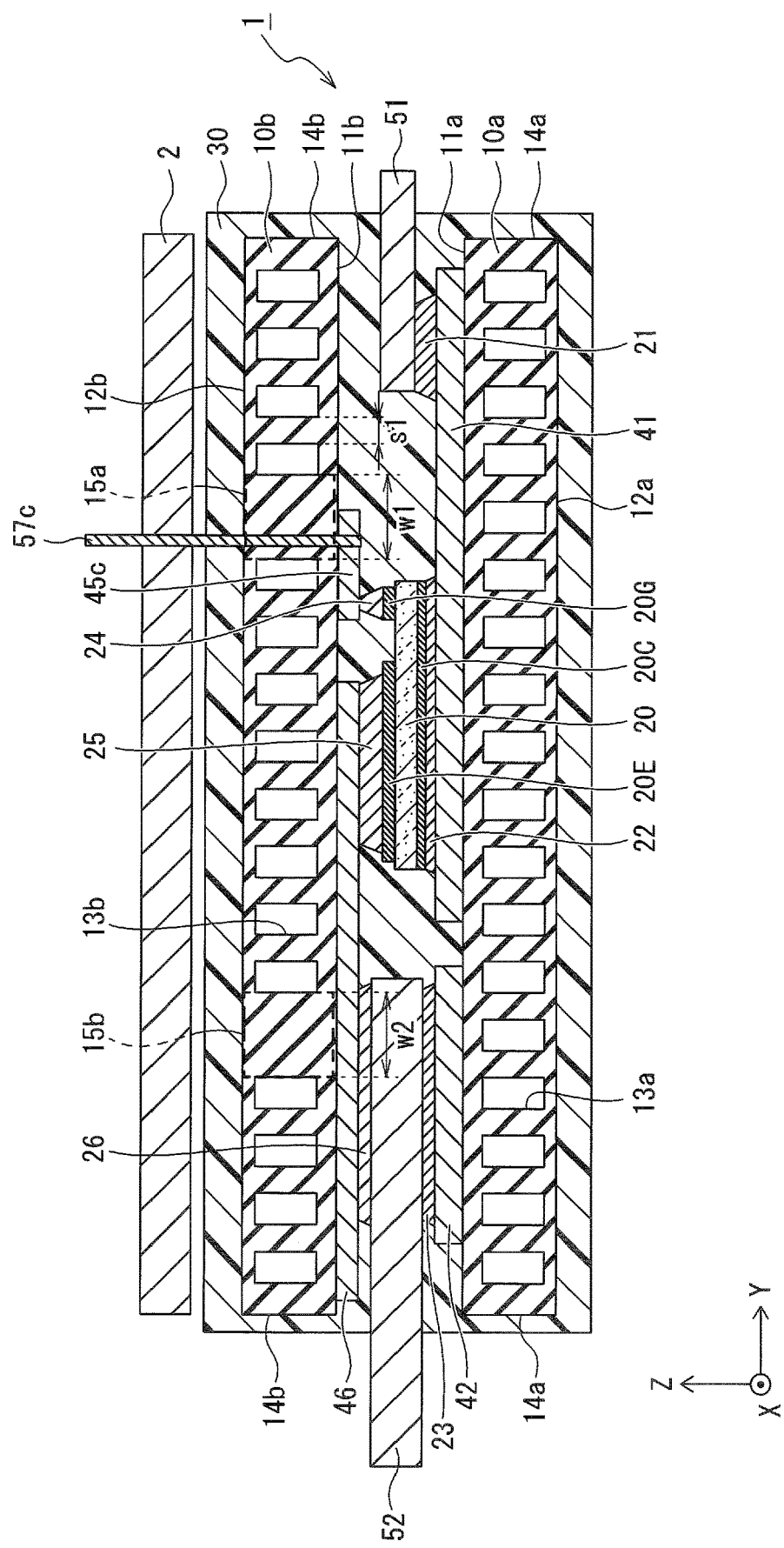
FIG. 13 is a cross-sectional view illustrating a semiconductor device according to a second modified example of the embodiment of the present invention.

As illustrated in FIG. 13, a semiconductor device 1 according to a second modified example of the embodiment of the present invention differs from the semiconductor device 1 according to the embodiment of the present invention illustrated in FIG. 2, in that the first buffer film 61 and the second buffer film 62 illustrated in FIG. 2 are excluded. The semiconductor device 1 may include only one of the first buffer film 61 and the second buffer film 62 illustrated in FIG. 2. The semiconductor device 1 according to the second modified example of the embodiment of the present invention thus has a reduced thickness due to the exclusion of the first buffer film 61 and the second buffer film 62.

Third Modified Example

Figure 14:
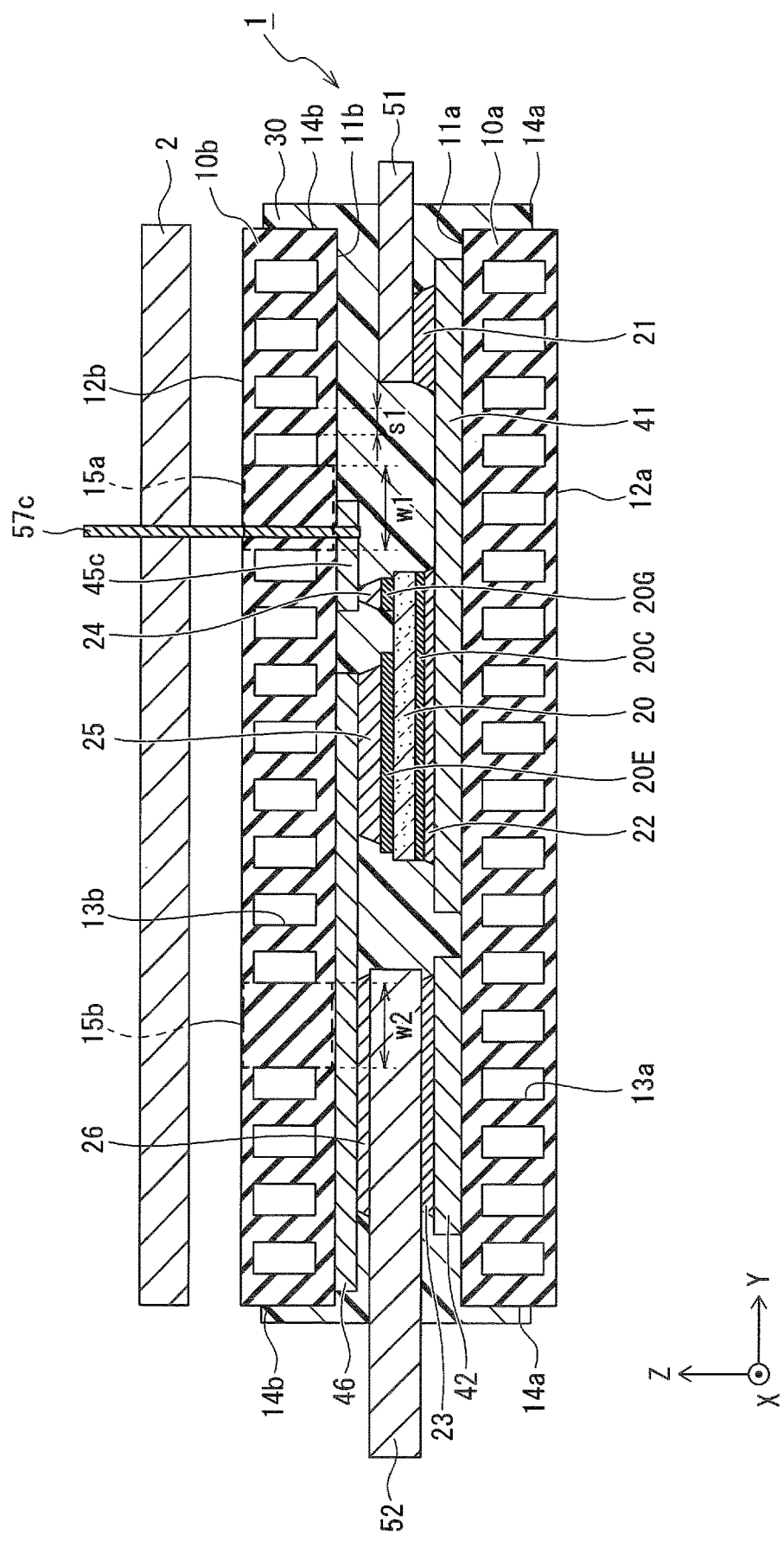
FIG. 14 is a cross-sectional view illustrating a semiconductor device according to a third modified example of the embodiment of the present invention.

As illustrated in FIG. 14, a semiconductor device 1 according to a third modified example of the embodiment of the present invention differs from the semiconductor device 1 according to the second modified example of the embodiment of the present invention illustrated in FIG. 13, in that the second main surface 12a of the first cooling device 10a and the fourth main surface 12b of the second cooling device 10b are not covered with the sealing member 30. The sealing member 30 covers the continuous region on the surface of the first cooling device 10a including the first main surface 11a and at least a part of the respective side surfaces 14a, in the cross-sectional view perpendicular to the longitudinal direction of the first flow channels 13a and the second flow channels 13b. The sealing member 30 also covers the continuous region on the surface of the second cooling device 10b including the third main surface 11b and at least a part of the respective side surfaces 14b, in the cross-sectional view perpendicular to the longitudinal direction of the first flow channels 13a and the second flow channels 13b.

Fourth Modified Example

Figure 15:
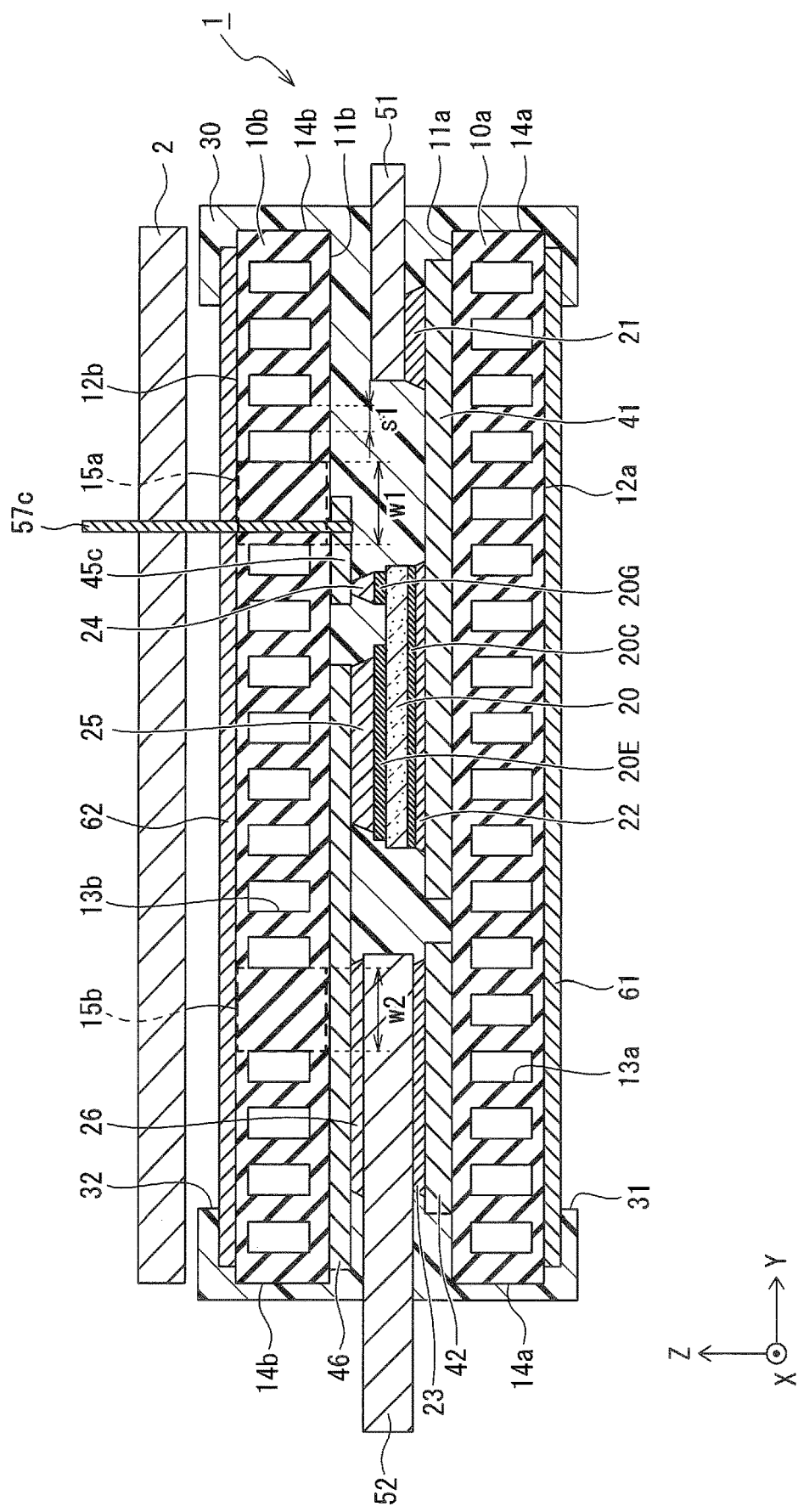
FIG. 15 is a cross-sectional view illustrating a semiconductor device according to a fourth modified example of the embodiment of the present invention.

As illustrated in FIG. 15, a semiconductor device 1 according to a fourth modified example of the embodiment of the present invention differs from the semiconductor device 1 according to the embodiment of the present invention illustrated in FIG. 2, in that the sealing member 30 has a first opening 31 at which the first buffer film 61 is exposed and a second opening 32 at which the second buffer film 62 is exposed. The exposed surfaces of the first buffer film 61 and the second buffer film 62 can be bonded to other circuit components or elements required to be cooled. Since the other components radiating heat are bonded to the first buffer film 61 and the second buffer film 62, which are bonded directly to the first cooling device 10a and the second cooling device 10b through which the fluid serving as a coolant flows, the cooling performance of the entire system can be enhanced.

Fifth Modified Example

Figure 16:
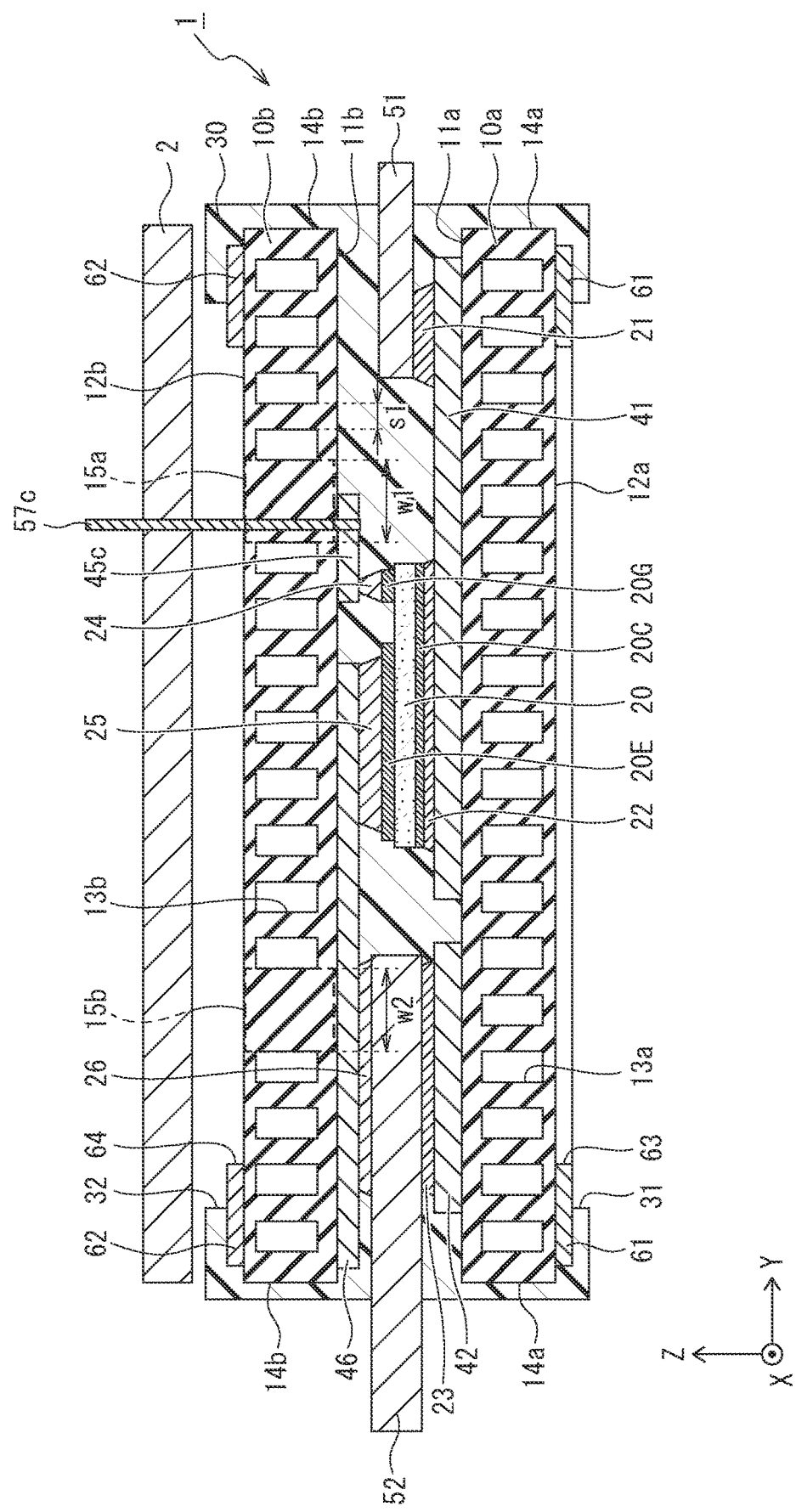
FIG. 16 is a cross-sectional view illustrating a semiconductor device according to a fifth modified example of the embodiment of the present invention.

As illustrated in FIG. 16, a semiconductor device 1 according to a fifth modified example of the embodiment of the present invention differs from the semiconductor device 1 according to the fourth modified example of the embodiment of the present invention illustrated in FIG. 15, in that the first buffer film 61 has a first opening 63 at which a part of the second main surface 12a of the first cooling device 10a is exposed, and in that the second buffer film 62 has a second opening 64 at which a part of the fourth main surface 12b of the second cooling device 10b is exposed. The exposed second main surface 12a at the first opening 63 and the exposed fourth main surface 12b at the second opening 64 can be bonded directly to other circuit components or elements required to be cooled. Accordingly, the cooling performance of the entire system can be enhanced.

Sixth Modified Example

Figure 17:
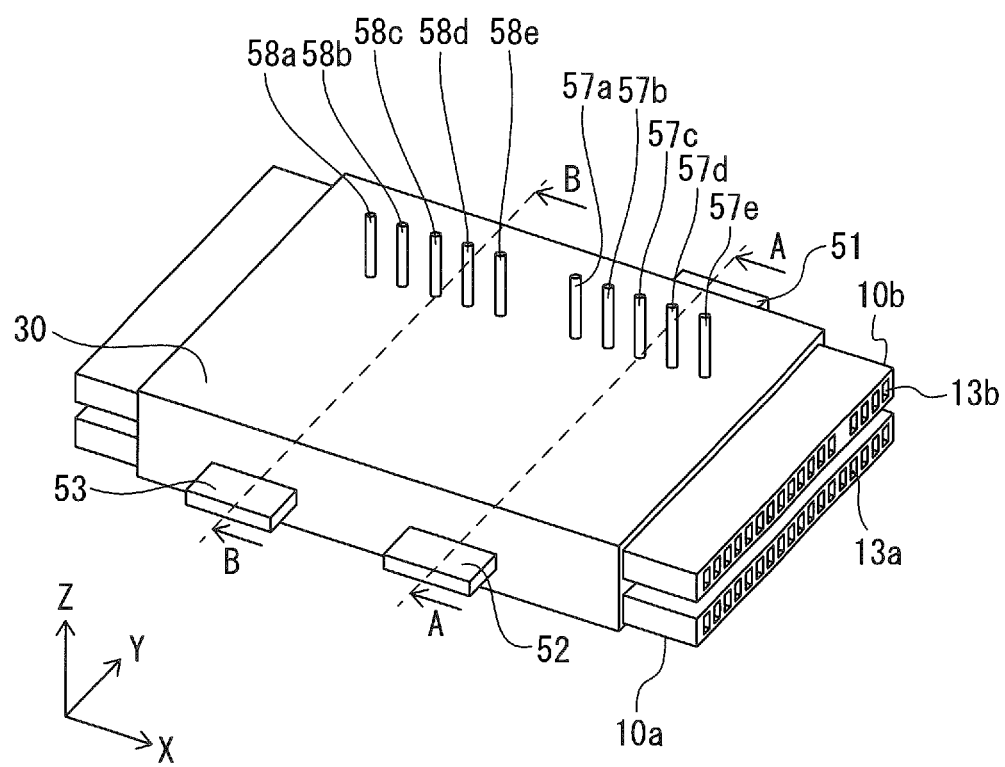
FIG. 17 is a perspective view illustrating a semiconductor device according to a sixth modified example of the embodiment of the present invention.

As illustrated in FIG. 17, a semiconductor device 1 according to a sixth modified example of the embodiment of the present invention differs from the semiconductor device 1 according to the embodiment of the present invention illustrated in FIG. 1, in that the respective sets of the control terminal 57a to 57e and the control terminals 58a to 58e are located at the same position in the Y-axis direction and aligned in line in the X-axis direction. Further, the semiconductor device 1 of this example differs from the semiconductor device 1 illustrated in FIG. 1 in that the third main terminal 53 projects from the sealing member 30 on the same side as the second main terminal 52.

Figure 18:
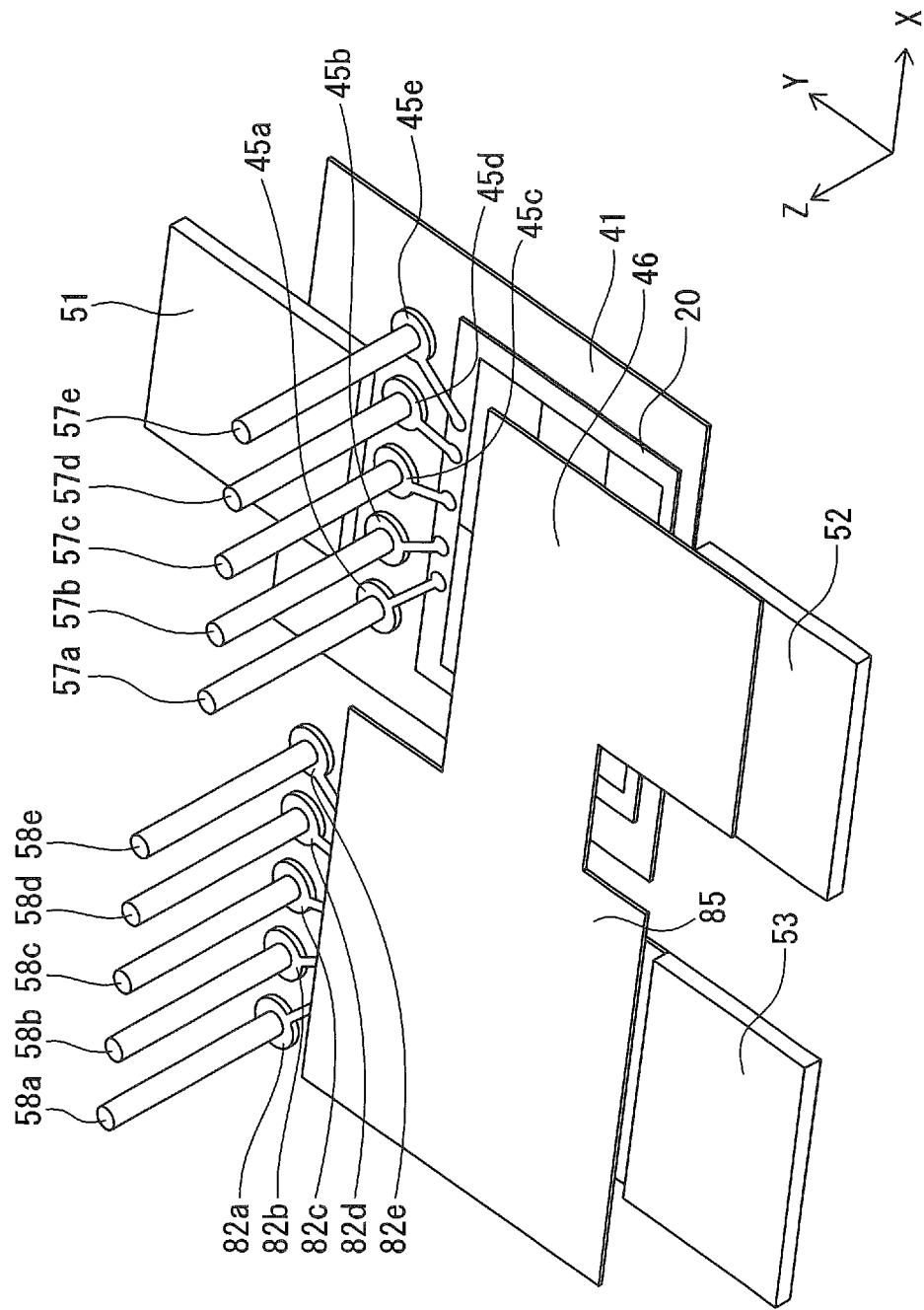
FIG. 18 is a perspective view omitting cooling devices and a sealing member illustrated in FIG. 17.

FIG. 18 is a perspective view of the semiconductor device 1, omitting the first cooling device 10a, the second cooling device 10b, and the sealing member 30 illustrated in FIG. 17. As illustrated in FIG. 18, the control terminals 57a to 57e are bonded to the second conductive pattern layers 45a to 45e, and the control terminals 58a to 58e are bonded to the first conductive pattern layers 82a to 82e.

Figure 19:
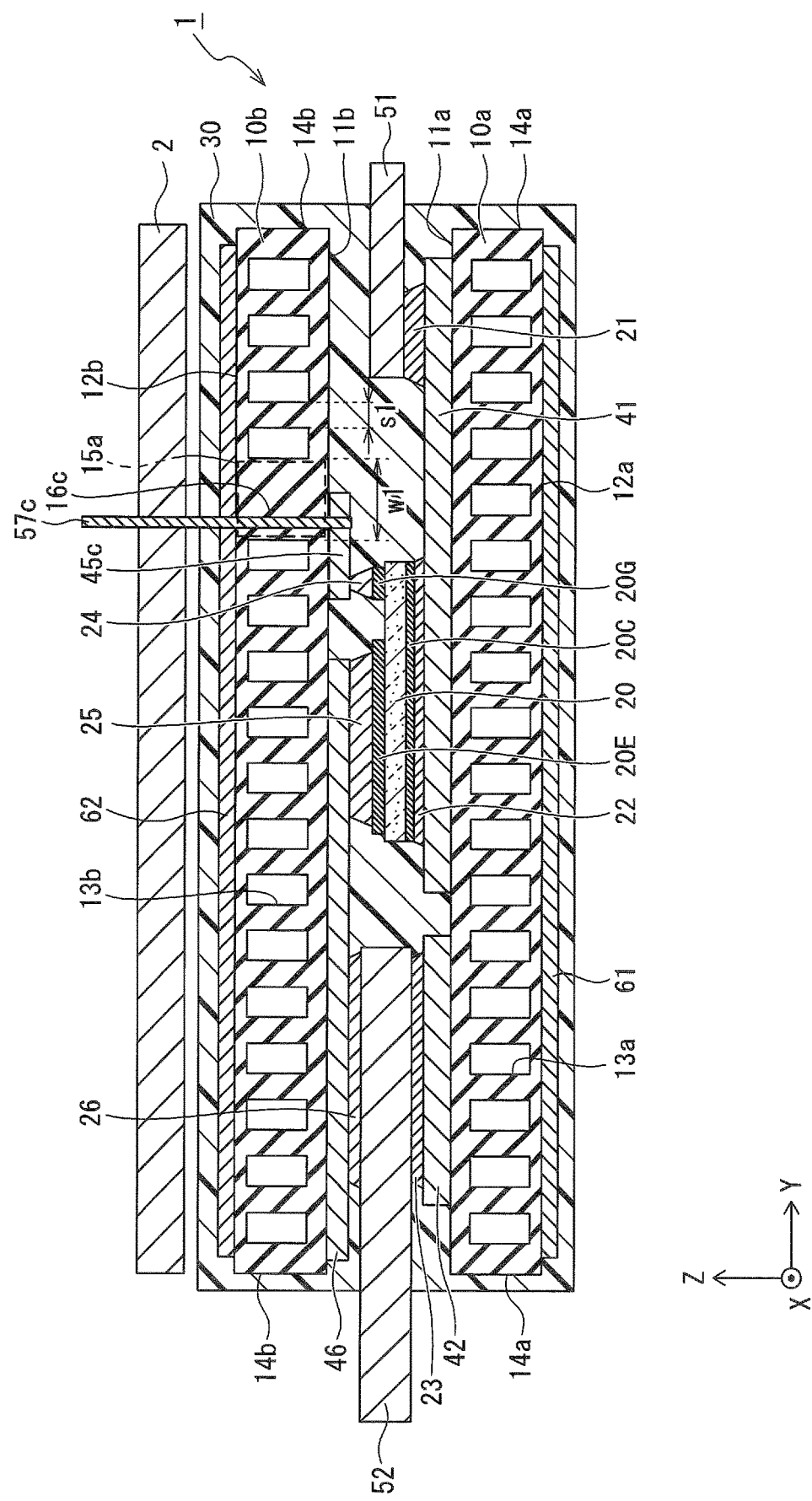
FIG. 19 is a cross-sectional view as viewed from direction A-A in FIG. 18.

FIG. 19 is a cross-sectional view as viewed from direction A-A in FIG. 17. The second cooling device 10b illustrated in FIG. 19 differs from the second cooling device 10b illustrated in FIG. 2 in including a single terminal-penetrating region 15a. The other structure of the second cooling device 10b of this example is the same as the second cooling device 10b illustrated in FIG. 2. The control terminals 57a to 57e and 58a to 58e illustrated in FIG. 17 and FIG. 18 penetrate the terminal-penetrating region 15a illustrated in FIG. 19.

Figure 20:
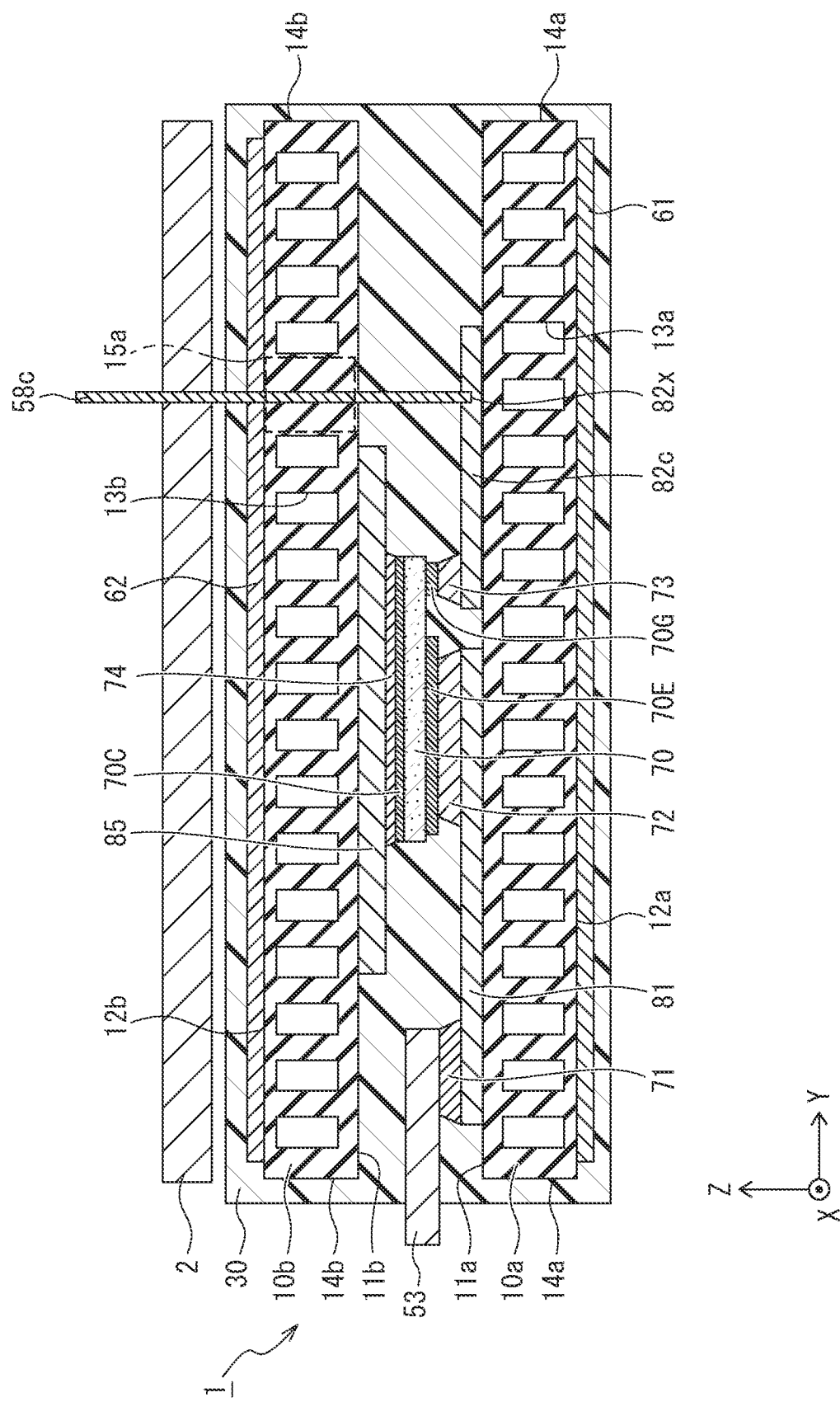
FIG. 20 is a cross-sectional view as viewed from direction B-B in FIG. 18.

FIG. 20 is a cross-sectional view as viewed from direction B-B in FIG. 17. The second semiconductor element 70 illustrated in FIG. 20 differs from the second semiconductor element 70 illustrated in FIG. 4 in having a topology inverted in the right-left direction. The other structure of the second semiconductor element 70 of this example is the same as the second semiconductor element 70 illustrated in FIG. 4.

The semiconductor device 1 according to the sixth modified example of the embodiment of the present invention includes the control terminals 57a to 57e and 58a to 58e arranged to be aligned in line in the X-axis direction. The arrangement of the control terminals 57a to 57e and 58a to 58e aligned in line in the X-axis direction can decrease the region occupied by the terminal-penetrating region 15a, as compared with the case in which the control terminals 57a to 57e and 58a to 58e are arranged in two lines, so as to increase the number of the second flow channels 13b of the second cooling device 10b.

Seventh Modified Example

Figure 21:
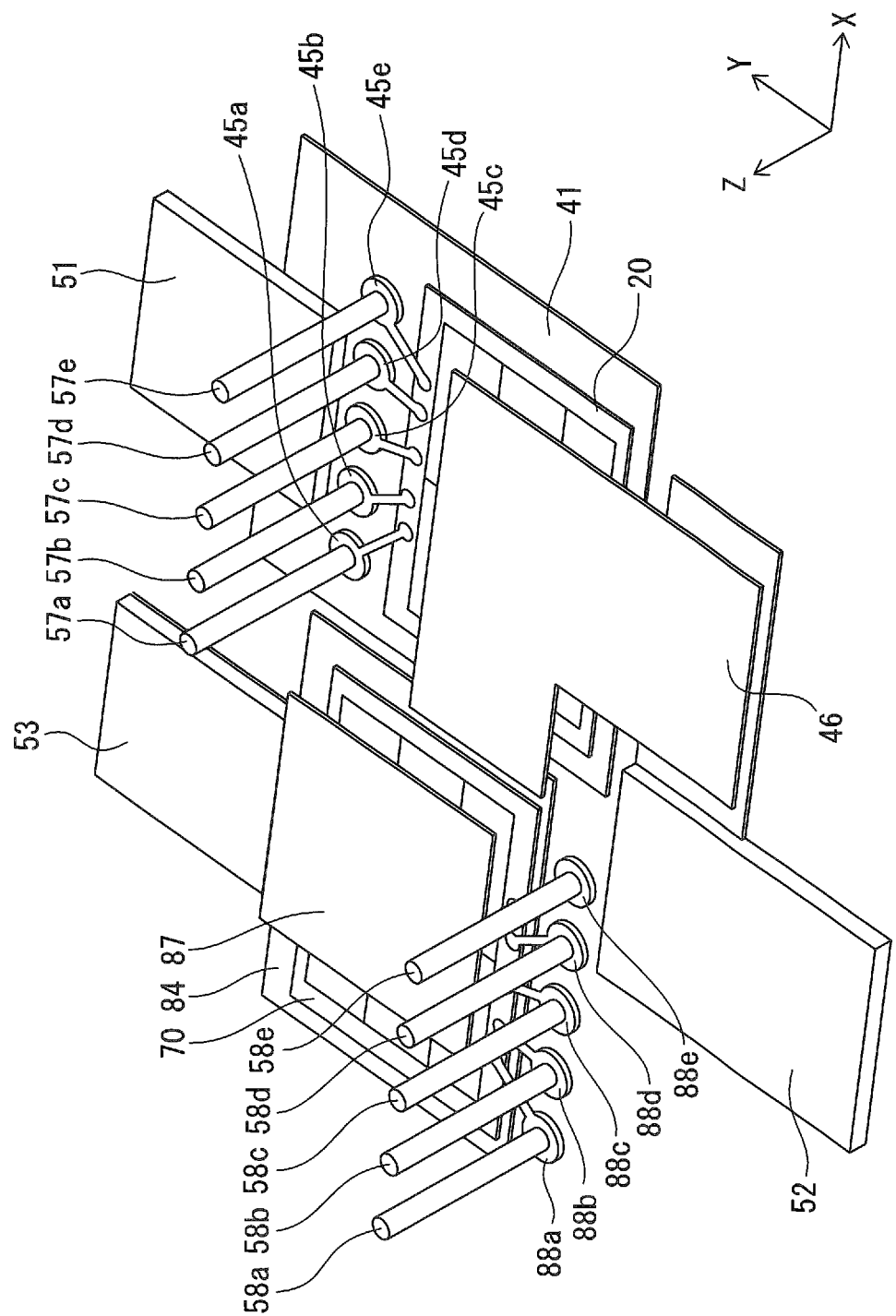
FIG. 21 is a perspective view illustrating a semiconductor device according to a seventh modified example of the embodiment of the present invention.

A semiconductor device 1 according to a seventh modified example of the embodiment of the present invention, as illustrated in the cross-sectional view of FIG. 21 omitting the first cooling device 10a, the second cooling device 10b, and the sealing member 30, includes the first semiconductor element 20 which has substantially the same structure as that in the semiconductor device 1 according to the embodiment of the present invention illustrated in FIG. 5, for example. The second semiconductor element 70 of this example differs from that in the semiconductor device 1 according to the embodiment of the present invention illustrated in FIG. 5 in having a topology inverted in the vertical direction. The control terminals 58a to 58e are bonded to second conductive pattern layers 88a, 88b, 88c, 88d, and 88e.

Figure 22:
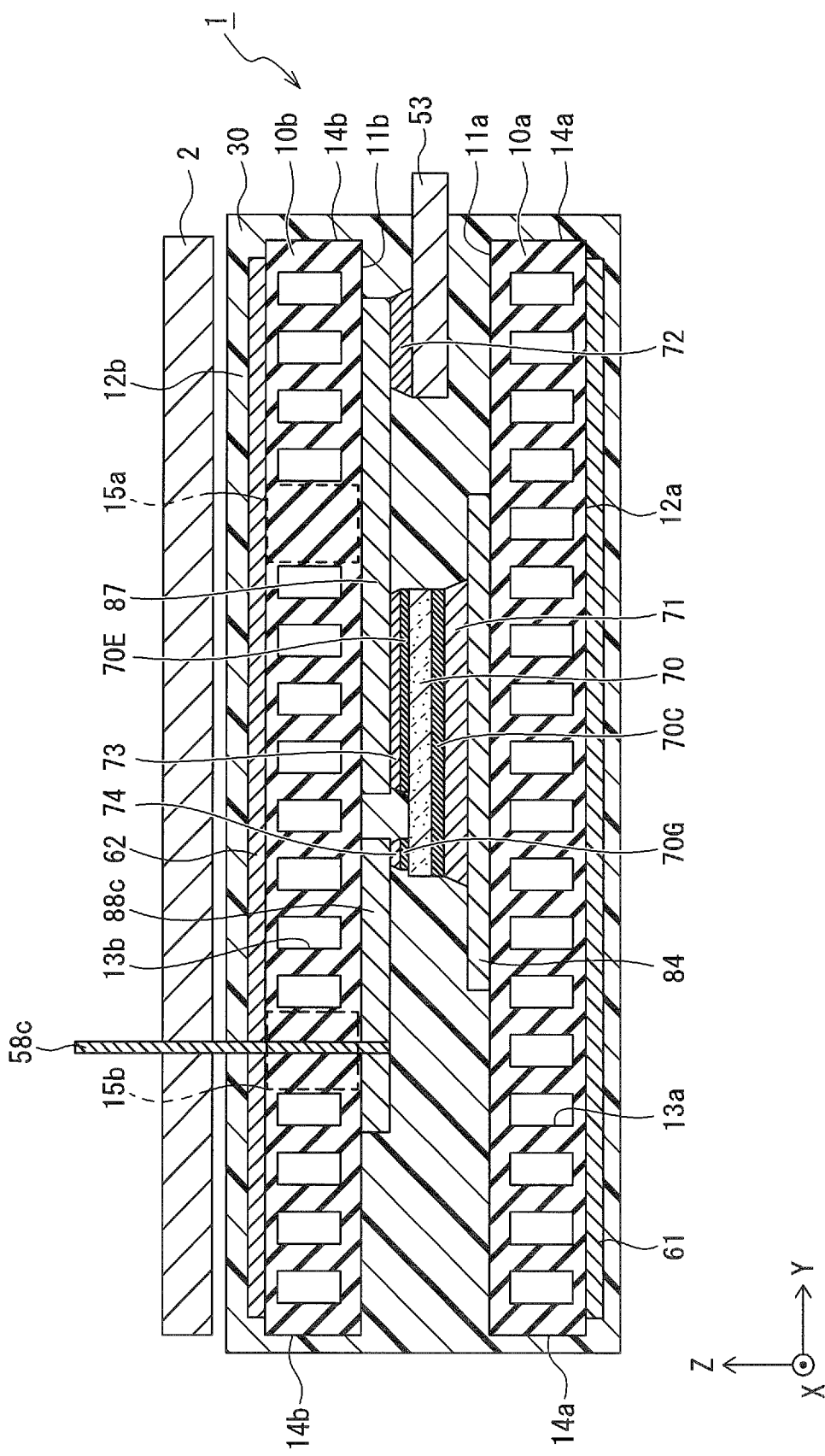
FIG. 22 is a cross-sectional view of the semiconductor device according to the seventh modified example of the embodiment of the present invention.

FIG. 22 is a cross-sectional view of the semiconductor device 1 according to the seventh modified example of the embodiment of the present invention, corresponding to the cross-sectional view as viewed from direction B-B in FIG. 1. A semiconductor element composing the second semiconductor element 70 includes the second main electrode 70C on the bottom surface side, and the first main electrode 70E and the control electrode 70G on the top surface side. The second main electrode 70C located on the bottom surface of the second semiconductor element 70 is bonded to a first conductive pattern layer 84 via the bonding material 71. The first conductive pattern layer 84 is connected to the second conductive pattern layer 46 illustrated in FIG. 21. The first main electrode 70E located on the top surface of the second semiconductor element 70 illustrated in FIG. 22 is bonded to one end of a second conductive pattern layer 87 via the bonding material 73. The other end of the second conductive pattern layer 87 is bonded to the third main terminal 53 via the bonding material 72.

The control electrode 20G located on the top surface of the first semiconductor element 20 is bonded to one end of the second conductive pattern layer 88c via the bonding material 74. The other end of the second conductive pattern layer 88c is bonded to the control terminal 58c. The control terminal 58c extends in the normal direction of the first main surface 11a (in the Z-axis direction), and penetrates from the third main surface 11b to the fourth main surface 12b in the second cooling device 10b within the terminal-penetrating region 15b in which the second flow channels 13b of the second cooling device 10b are not provided. The control terminal 58c projects to the outside of the sealing member 30 above the fourth main surface 12b of the second cooling device 10b so as to be connected to the control substrate 2.

The semiconductor device 1 according to the seventh modified example of the embodiment of the present invention including the second semiconductor element 70 having the vertically-inverted topology, can also allow the control terminals 58a to 58e to penetrate the second cooling device 10b so as to be led out from the fourth main surface 12b.

Eighth Modified Example

Figure 23:
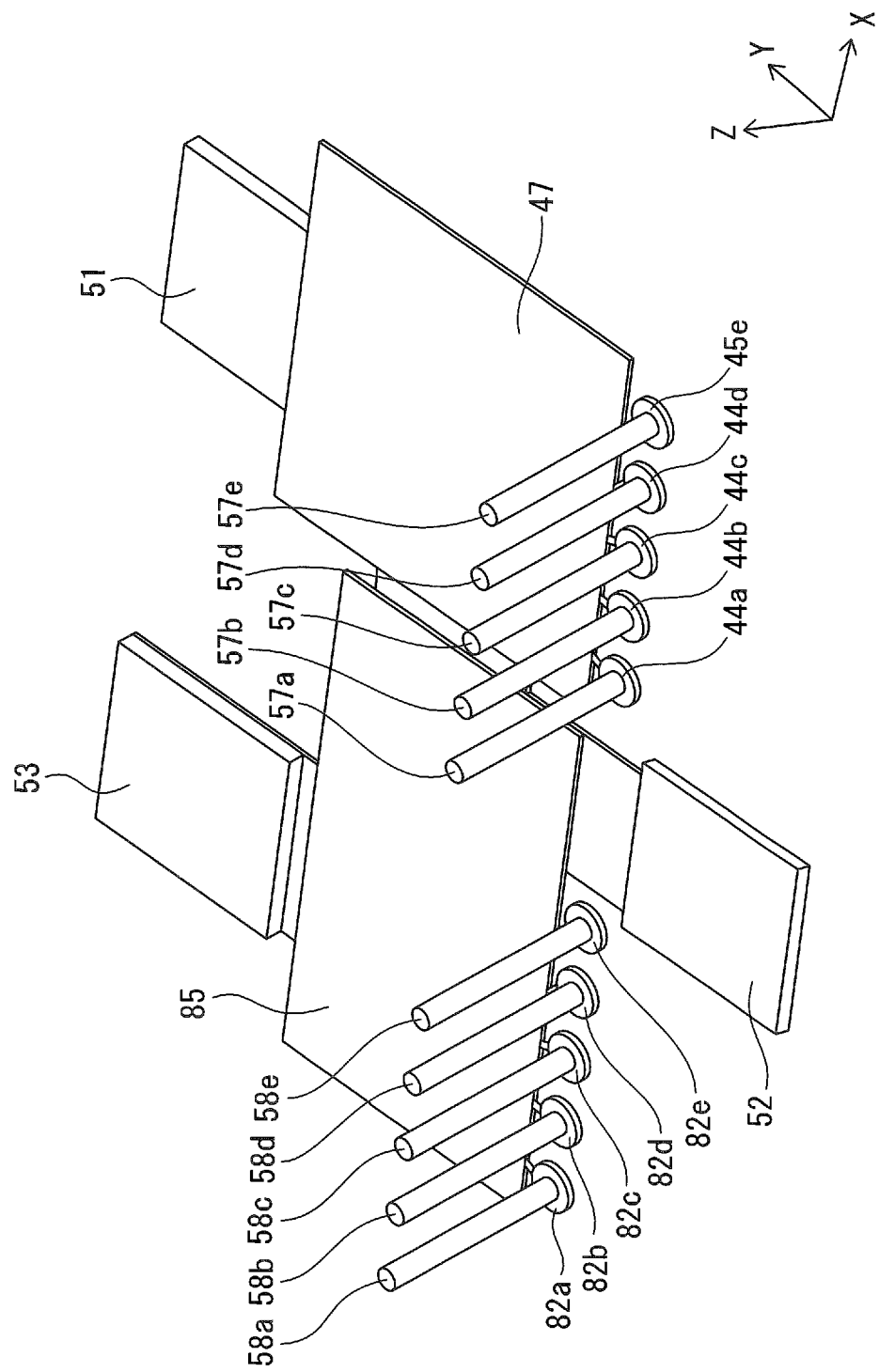
FIG. 23 is a perspective view illustrating a semiconductor device according to an eighth modified example of the embodiment of the present invention.
Figure 24:
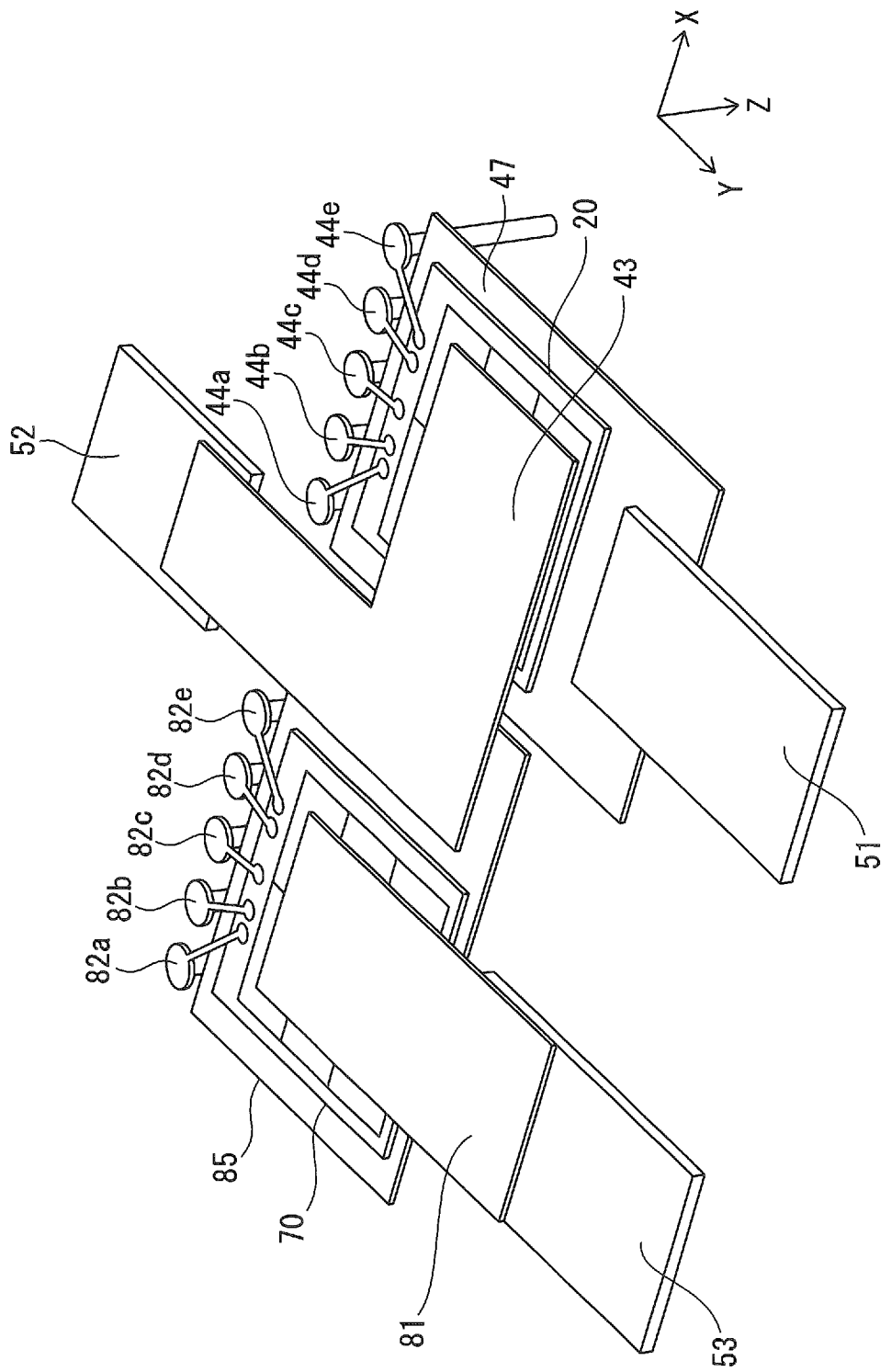
FIG. 24 is a vertically-inverted perspective view corresponding to FIG. 23.

A semiconductor device 1 according to an eighth modified example of the embodiment of the present invention, as illustrated in the cross-sectional view of FIG. 23 and FIG. 24 omitting the first cooling device 10a, the second cooling device 10b, and the sealing member 30, includes the second semiconductor element 70 which has substantially the same structure as that in the semiconductor device 1 according to the embodiment of the present invention illustrated in FIG. 5, for example. The first semiconductor element 20 of this example differs from that in the semiconductor device 1 according to the embodiment of the present invention in having a topology inverted in the vertical direction. FIG. 24 is an inverted perspective view of FIG. 23 vertically inverted about a rotation axis in the X-axis direction.

The control terminals 57a to 57e and 58a to 58e are located at the same position in the Y-axis direction and aligned in line in the X-axis direction. The control terminals 57a to 57e are bonded to first conductive pattern layers 44a, 44b, 44c, 44d, and 44e, and the control terminals 58a to 58e are bonded to the first conductive pattern layers 82a to 82e.

Figure 25:
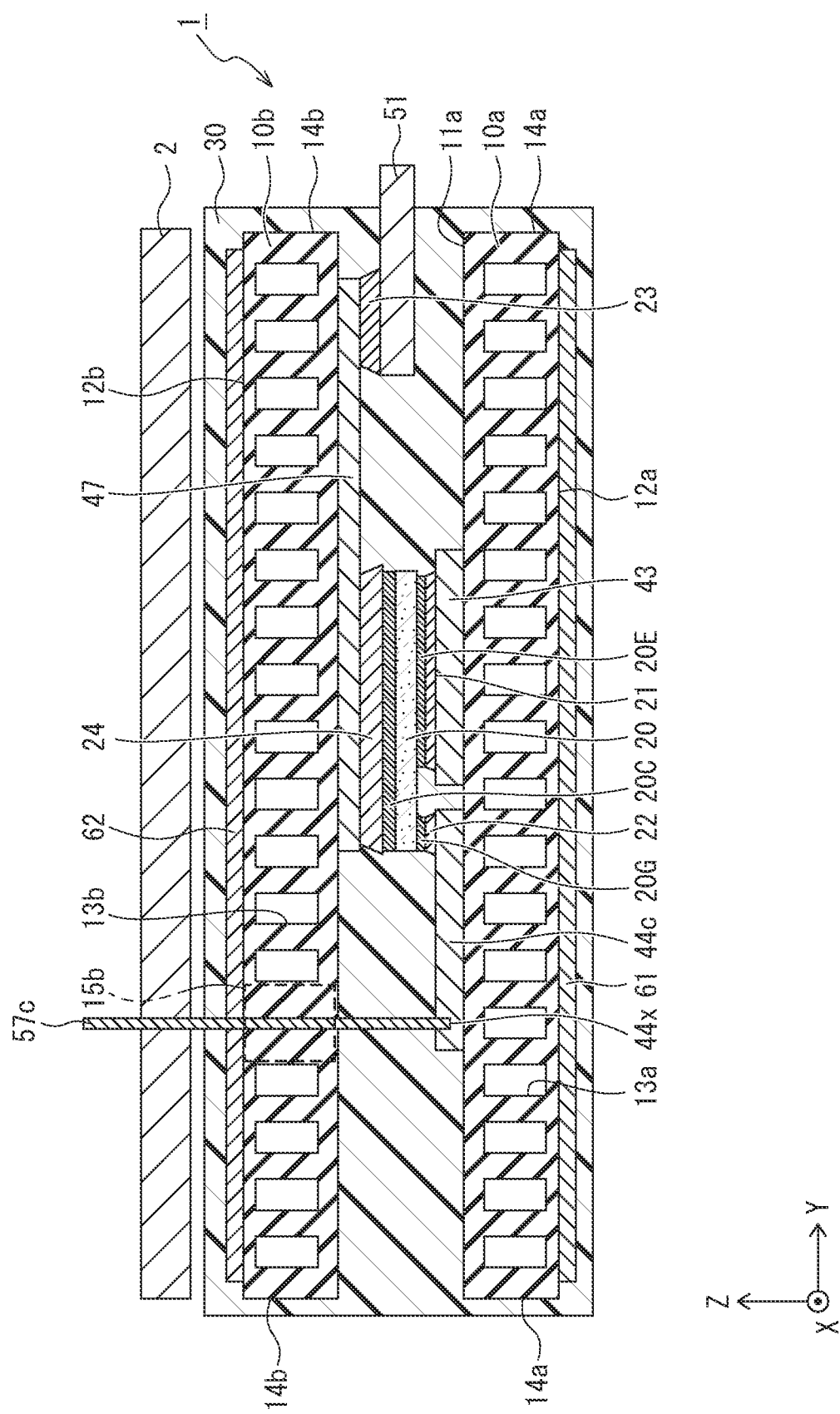
FIG. 25 is a cross-sectional view illustrating the semiconductor device according to the eighth modified example of the embodiment of the present invention.

FIG. 25 is a cross-sectional view of the semiconductor device 1 according to the eighth modified example of the embodiment of the present invention, corresponding to the cross-sectional view as viewed from direction A-A in FIG. 1. A semiconductor element composing the first semiconductor element 20 includes the first main electrode 20E and the control electrode 20G on the bottom surface side, and the second main electrode 20C on the top surface side. The second main electrode 20C located on the top surface of the first semiconductor element 20 is bonded to one end of a second conductive pattern layer 47 via the bonding material 24. The other end of the second conductive pattern layer 47 is bonded to the first main terminal 51 via the bonding material 23. The first main electrode 20E located on the bottom surface of the first semiconductor element 20 is bonded to a first conductive pattern layer 43 via the bonding material 21. The first conductive pattern layer 43 is connected to the second conductive pattern layer 85 and the second main terminal 52 illustrated in FIG. 23 and FIG. 24. The control electrode 20G located on the bottom surface of the first semiconductor element 20 is bonded to one end of the first conductive pattern layer 44c via the bonding material 22.

The other end of the first conductive pattern layer 44c is provided with a recess 44x. A penetration hole penetrating the first conductive pattern layer 44c may be provided instead of the recess 44x. The control terminal 57c is inserted to the recess 44x of the first conductive pattern layer 44c. The control terminal 57c is bonded to the first conductive pattern layer 44c by pressure welding or with a bonding material, for example.

The control terminal 57c extends in the normal direction of the first main surface 11a (in the Z-axis direction), and penetrates from the third main surface 11b to the fourth main surface 12b in the second cooling device 10b within the terminal-penetrating region 15b in which the second flow channels 13b of the second cooling device 10b are not provided. The control terminal 57c projects to the outside of the sealing member 30 above the fourth main surface 12b of the second cooling device 10b so as to be connected to the control substrate 2.

The semiconductor device 1 according to the eighth modified example of the embodiment of the present invention including the first semiconductor element 20 having the vertically-inverted topology, can also allow the control terminals 57a to 57e to penetrate the second cooling device 10b so as to be led out from the fourth main surface 12b.

Other Embodiments

As described above, the invention has been described according to the embodiments, but it should not be understood that the description and drawings implementing a portion of this disclosure limit the invention. Various alternative embodiments of the present invention, examples, and operational techniques will be apparent to those skilled in the art from this disclosure.

The embodiment of the present invention has been illustrated above with the 2-in-1 power semiconductor module in which the two semiconductor chips of the first semiconductor element 20 and the second semiconductor element 70 are mounted, but is not limited to this illustration. For example, a single semiconductor chip may be mounted in the semiconductor module, or three or more semiconductor chips may be mounted in the semiconductor module. While the embodiment of the present invention has been illustrated above with the case of including the ten control terminals 57a to 57e and 58a to 58e, the number of the control terminals may be determined as appropriate. The number of the control terminals used in each of the first semiconductor element 20 and the second semiconductor element 70 may differ from each other.

As described above, the invention includes various embodiments of the present invention and the like not described herein. Therefore, the scope of the present invention is defined only by the technical features specifying the present invention, which are prescribed by claims, the words and terms in the claims shall be reasonably construed from the subject matters recited in the present Specification.

What is claimed is:

1. A semiconductor device comprising:
   a first cooling device including a plurality of first flow channels through which a fluid is to flow, between a first main surface and a second main surface opposed to each other;
   a second cooling device including a plurality of second flow channels through which a fluid is to flow, between a third main surface and a fourth main surface parallel to the first main surface;
   a semiconductor element interposed between the first main surface and the third main surface facing each other; and
   a control terminal penetrating from the third main surface to the fourth main surface in a terminal-penetrating region provided at a position between adjacent second flow channels among the plurality of second flow channels, and electrically connected to a control electrode of the semiconductor element.

2. The semiconductor device of claim 1, further comprising:
   a plurality of first conductive patterned layers bonded to the first main surface; and
   a plurality of second conductive patterned layers bonded to the third main surface,
   wherein
   the semiconductor element has a first main surface and a second main surface,
   the first main surface of the semiconductor element is opposed to the first main surface of the first cooling device via at least a part of the first conductive pattern layers, and
   the second main surface of the semiconductor element is opposed to the third main surface of the second cooling device via at least a part of the second conductive pattern layers.

3. The semiconductor device of claim 1, wherein:
   the plurality of second flow channels extend in a first direction parallel to the first main surface, and are aligned in a second direction perpendicular to the first direction; and
   the terminal-penetrating region extends in the first direction.

4. The semiconductor device of claim 3, wherein:
   the semiconductor element includes a first main electrode on the main surface on which the control electrode is located;
   the second flow channels are located at least at a position overlapping with the first main electrode in the second direction; and
   the terminal-penetrating region is located on an outer side of the position overlapping with the first main electrode in the second direction.

5. The semiconductor device of claim 4, further comprising a first main terminal connected to the first main electrode and extending in parallel to the first main surface.

6. The semiconductor device of claim 1, wherein the control terminal comprises a plurality of control terminals, arranged in a line or two lines, in a first direction parallel to the first main surface.

7. The semiconductor device of claim 1, wherein the control terminal comprises a plurality of control terminals, connected to the semiconductor element and arranged in a line or two lines, in a first direction parallel to the first main surface.

8. The semiconductor device of claim 2, wherein the control terminal is electrically connected to the control electrode via at least a part of the first conductive pattern layers.

9. The semiconductor device of claim 2, wherein the control terminal is electrically connected to the control electrode via at least a part of the second conductive pattern layers.

10. A cooling module comprising:
    a first cooling device including a plurality of first flow channels through which a fluid is to flow, between a first main surface and a second main surface opposed to each other; and
    a second cooling device including a plurality of second flow channels through which a fluid is to flow, between a third main surface and a fourth main surface parallel to the first main surface,
    wherein a terminal-penetrating region is defined in the second cooling device through which a control terminal, which is electrically connected to a control electrode of a semiconductor element interposed between the first main surface and the third main surface facing each other, penetrates from the third main surface to the fourth main surface at a position between adjacent second flow channels among the plurality of second flow channels.

11. A power converting device comprising:
- a first cooling device including a plurality of first flow channels through which a fluid is to flow, between a first main surface and a second main surface opposed to each other;
- a second cooling device including a plurality of second flow channels through which a fluid is to flow, between a third main surface and a fourth main surface parallel to the first main surface;
- a semiconductor element interposed between the first main surface and the third main surface facing each other;
- a control terminal penetrating from the third main surface to the fourth main surface in a terminal-penetrating region provided at a position between adjacent second flow channels among the plurality of second flow channels, and electrically connected to a control electrode of the semiconductor element;
- a control substrate on which a circuit electrically connected to the control terminal is mounted; and
- a capacitor arranged toward the second main surface of the first cooling device.

12. An electric vehicle comprising:
- a first cooling device including a plurality of first flow channels through which a fluid is to flow, between a first main surface and a second main surface opposed to each other;
- a second cooling device including a plurality of second flow channels through which a fluid is to flow, between a third main surface and a fourth main surface parallel to the first main surface;
- a semiconductor element interposed between the first main surface and the third main surface facing each other;
- a control terminal penetrating from the third main surface to the fourth main surface in a terminal-penetrating region provided at a position between adjacent second flow channels among the plurality of second flow channels, and electrically connected to a control electrode of the semiconductor element;
- a control substrate on which a circuit electrically connected to the control terminal is mounted;
- a capacitor arranged toward the second main surface of the first cooling device;
- a power source for supplying electricity to the semiconductor element; and
- a load driven by the semiconductor element.

\* \* \* \* \*